(12) United States Patent
Ohno et al.

(10) Patent No.: US 7,081,289 B2
(45) Date of Patent: Jul. 25, 2006

(54) PHASE-CHANGE RECORDING MATERIAL AND INFORMATION RECORDING MEDIUM

(75) Inventors: Takashi Ohno, Tokyo (JP); Michikazu Horie, Tokyo (JP)

(73) Assignee: Mitsubishi Kagaku Media Co., Ltd., Tokyo (JP)

(*) Notice: Subject to any disclaimer, the term of this patent is extended or adjusted under 35 U.S.C. 154(b) by 0 days.

(21) Appl. No.: 11/113,119

(22) Filed: Apr. 25, 2005

(65) Prior Publication Data

US 2005/0202200 A1 Sep. 15, 2005

Related U.S. Application Data

(63) Continuation of application No. PCT/JP04/04002, filed on Mar. 25, 2004.

(30) Foreign Application Priority Data

Mar. 24, 2003 (JP) ............................ 2003-079834

(51) Int. Cl.
*B32B 3/02* (2006.01)

(52) U.S. Cl. .................. 428/64.1; 428/64.4; 428/64.5; 430/270.13

(58) Field of Classification Search ............... 428/64.5; 430/270.13

See application file for complete search history.

(56) References Cited

U.S. PATENT DOCUMENTS

| | | | |
|---|---|---|---|
| 3,530,441 A | 9/1970 | Ovshinsky |
| 4,629,649 A | 12/1986 | Osaka et al. |
| 4,710,452 A | 12/1987 | Raychaudhuri |
| 4,774,170 A | 9/1988 | Pan et al. |
| 4,795,695 A | 1/1989 | Pan et al. |
| 4,798,785 A | 1/1989 | Pan et al. |
| 4,812,385 A | 3/1989 | Pan et al. |
| 4,812,386 A | 3/1989 | Pan et al. |
| 4,865,955 A | 9/1989 | Pan et al. |
| 4,904,577 A | 2/1990 | Tyan et al. |
| 4,960,680 A | 10/1990 | Pan et al. |
| 4,981,772 A | 1/1991 | Pan et al. |
| 5,055,331 A | 10/1991 | Raychaudhuri |
| 5,077,181 A | 12/1991 | Pan et al. |
| 5,234,803 A | 8/1993 | Raychaudhuri |
| 5,271,978 A | 12/1993 | Vazan et al. |
| 5,312,664 A | 5/1994 | Raychaudhuri |

(Continued)

FOREIGN PATENT DOCUMENTS

EP 0 184 452 A2 6/1986

(Continued)

OTHER PUBLICATIONS

U.S. Appl. No. 11/104,542, filed Apr. 13, 2005, Ohno et al.

(Continued)

*Primary Examiner*—Elizabeth Mulvaney
(74) *Attorney, Agent, or Firm*—Oblon, Spivak, McClelland, Maier & Neustadt, P.C.

(57) ABSTRACT

A phase-change recording material on which high speed recording/erasing is possible, which has excellent recording characteristics, which has a high storage stability of recording signals and which is excellent in the repeated recording durability, and an information recording medium using the above material are provided. A phase-change recording material characterized by containing as the main component a composition represented by $\{(Sb_{1-x}Ge_x)_{1-y}In_y\}_{1-z-w}M_z$-$Te_w$ wherein x, y, z and w are numbers satisfying $0.001 \leq x \leq 0.3$, $0 \leq y \leq 0.4$, $0 \leq z \leq 0.2$ and $0 \leq w \leq 0.1$, and M is at least one element selected from lanthanoids, provided that z and w are not 0 at the same time.

11 Claims, 7 Drawing Sheets

U.S. PATENT DOCUMENTS

| | | | |
|---|---|---|---|
| 5,557,596 | A | 9/1996 | Gibson et al. |
| 5,849,458 | A | 12/1998 | Pan et al. |
| 5,879,773 | A | 3/1999 | Hatwar et al. |
| 6,004,646 | A | 12/1999 | Ohno et al. |
| 6,108,295 | A | 8/2000 | Ohno et al. |
| 6,115,352 | A | 9/2000 | Ohno et al. |
| 6,143,468 | A | 11/2000 | Ohno et al. |
| 6,294,310 | B1 | 9/2001 | Ohno et al. |
| 6,314,014 | B1 | 11/2001 | Lowrey et al. |
| 6,567,367 | B1 | 5/2003 | Ohno et al. |
| 6,587,425 | B1 | 7/2003 | Ohno et al. |
| 6,632,583 | B1 | 10/2003 | Kunitomo et al. |
| 6,707,783 | B1 | 3/2004 | Ohno |
| 6,811,949 | B1 | 11/2004 | Ohno et al. |
| 2002/0001284 | A1 | 1/2002 | Inoue et al. |
| 2002/0012305 | A1 | 1/2002 | Shingai et al. |
| 2002/0015816 | A1 | 2/2002 | Shingai et al. |
| 2002/0146643 | A1* | 10/2002 | Shingai et al. ......... 430/270.13 |
| 2002/0160305 | A1 | 10/2002 | Horie et al. |
| 2003/0214857 | A1 | 11/2003 | Horie et al. |

FOREIGN PATENT DOCUMENTS

| | | |
|---|---|---|
| JP | 60-177446 | 9/1985 |
| JP | 61-156545 | 7/1986 |
| JP | 62-246788 | 10/1987 |
| JP | 63-76121 | 4/1988 |
| JP | 63-201927 | 8/1988 |
| JP | 63-244422 | 10/1988 |
| JP | 63-298726 | 12/1988 |
| JP | 64-14083 | 1/1989 |
| JP | 64-59651 | 3/1989 |
| JP | 64-60832 | 3/1989 |
| JP | 2-64929 | 3/1990 |
| JP | 2-88288 | 3/1990 |
| JP | 4-501742 | 3/1992 |
| JP | 4-232780 | 8/1992 |
| JP | 9-286174 | 11/1997 |
| JP | 9-286175 | 11/1997 |
| JP | 11-232696 | 8/1999 |
| JP | 11-240250 | 9/1999 |
| JP | 2000-79761 | 3/2000 |
| JP | 2000-233576 | 8/2000 |
| JP | 2000-313170 | 11/2000 |
| JP | 2001-39031 | 2/2001 |
| JP | 2001-67719 | 3/2001 |
| JP | 2002-8236 | 1/2002 |
| JP | 2002-11958 | 1/2002 |
| JP | 2002-79757 | 3/2002 |
| JP | 2002-92938 | 3/2002 |
| JP | 2002-157737 | 5/2002 |
| JP | 2002-172860 | 6/2002 |
| JP | 2002-269806 | 9/2002 |
| JP | 2002-347341 | 12/2002 |
| JP | 2003-191638 | 7/2003 |
| JP | 2003-231354 | 8/2003 |
| JP | 2003-291534 | 10/2003 |
| JP | 2003-335065 | 11/2003 |

OTHER PUBLICATIONS

U.S. Appl. No. 11/113,119, filed Apr. 25, 2005, Ohno et al.

U.S. Appl. No. 09/530,599, filed May 9, 2000, Mizuno et al.

U.S. Appl. No. 09/573,319, filed May 18, 2000, Nobukuni et al.

J. Feinleib, et al., "Rapid Reversible Light-Induced Crystallization of Amorphous Semiconductors", Applied Physics Letters, vol. 18, No. 6, Mar. 15, 1971, pp. 254-257.

Michikazu Horie, et al., "High speed rewritable DVD up to 20m/s with nucleation-free eutectic phase-change material of $Ge(Sb_{70}Te_{30})$+Sb", Proceedings of SPIE, Optical Data Storage 2000, vol. 4090, May 14-17, 2000, pp. 135-143.

Michikazu Horie, et al., "Material Characterization of Growth-Dominant Ge(Sb70Te30)+Sb for Phase-Change Optical Recording Media", Proceedings of the 13th Symposium on Phase Change Optical Information Storage, PCOS2001, 2001, pp. 20-25.

I. Friedrich, et al., "Structural transformations of $Ge_2Sb_2Te_5$ films studied by electrical resistance measurements", Journal of Applied Physics, vol. 87, No. 9, May 1, 2000, pp. 4130-4134.

C. N. Afonso, el al., "Ultrafast reversible phase change in GeSb films for erasable optical storage", Appl. Phys. Lett., vol. 60, No. 25, Jun. 22, 1992, pp. 3123-3125.

Kazuya Nakayama, et al., "Phase-change switching memory", Proceedings of the 13th Symposium on Phase Change Optical Information Storage, PCOS2001, 2001, pp. 61-66 and 111.

* cited by examiner

Recording/retrieving
laser beam incidence

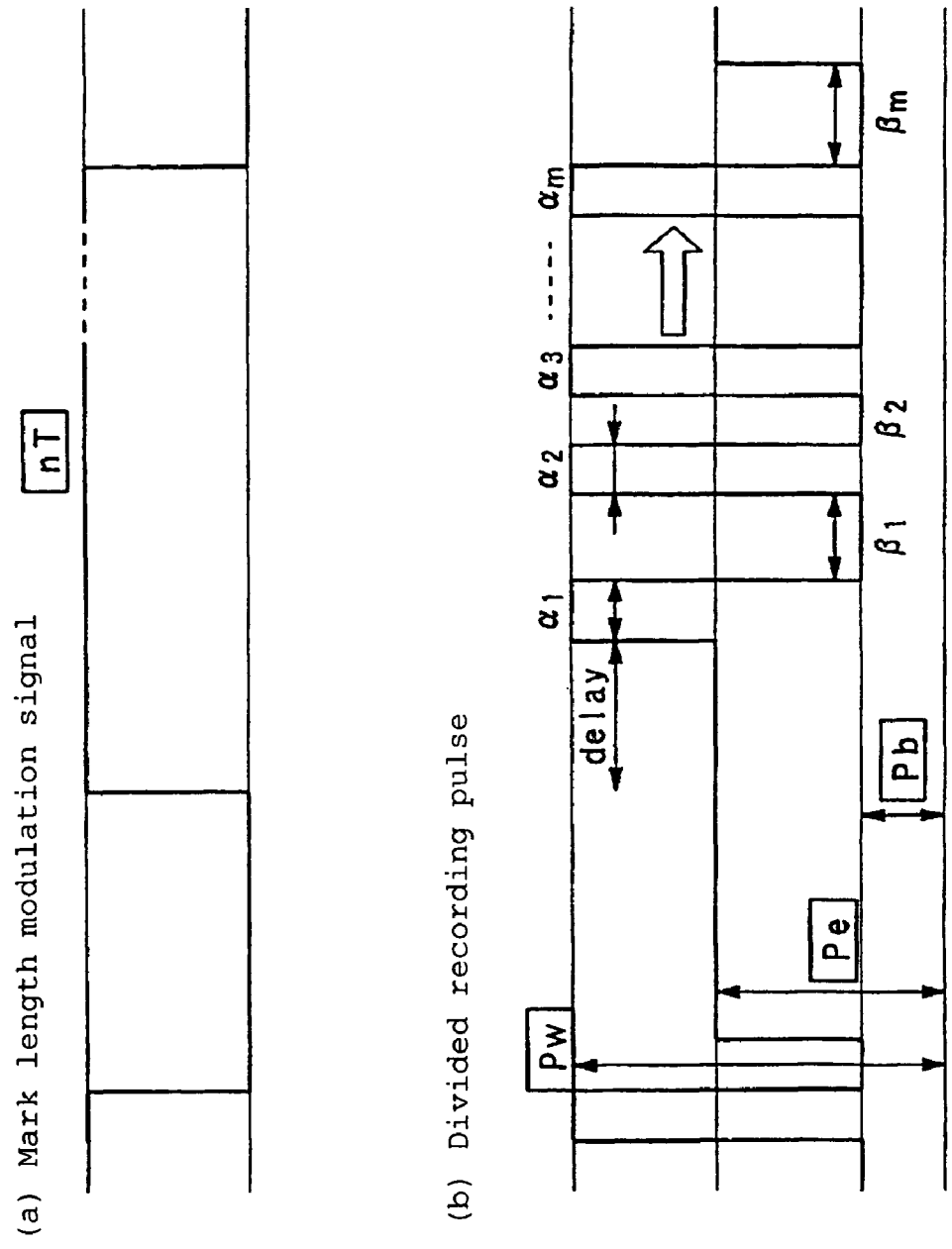

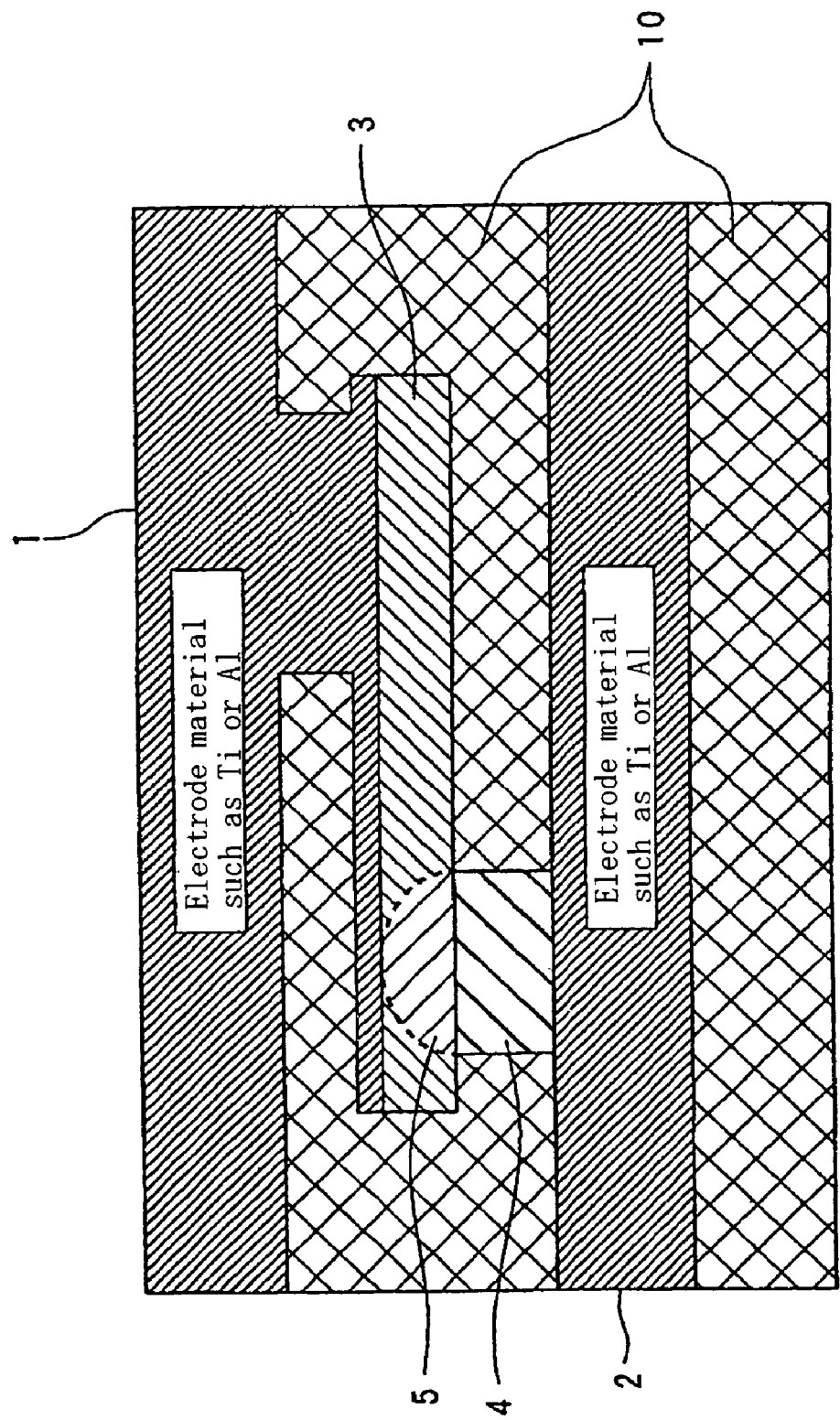

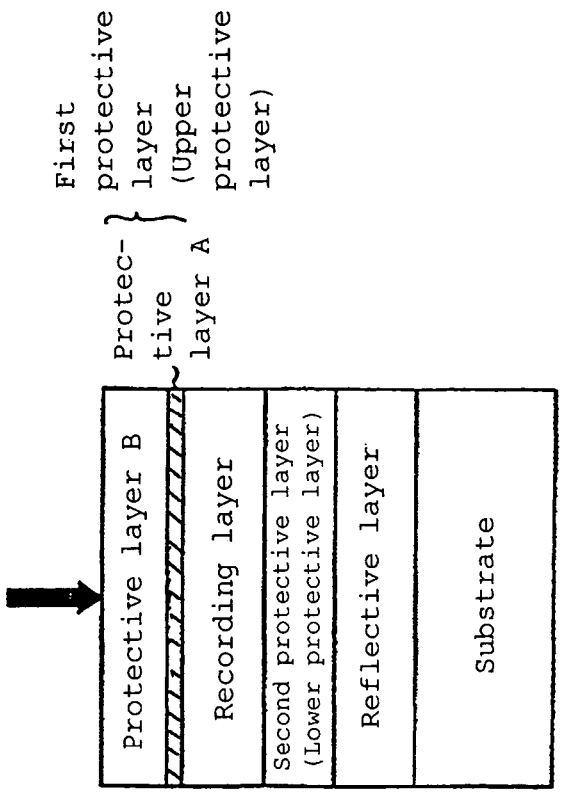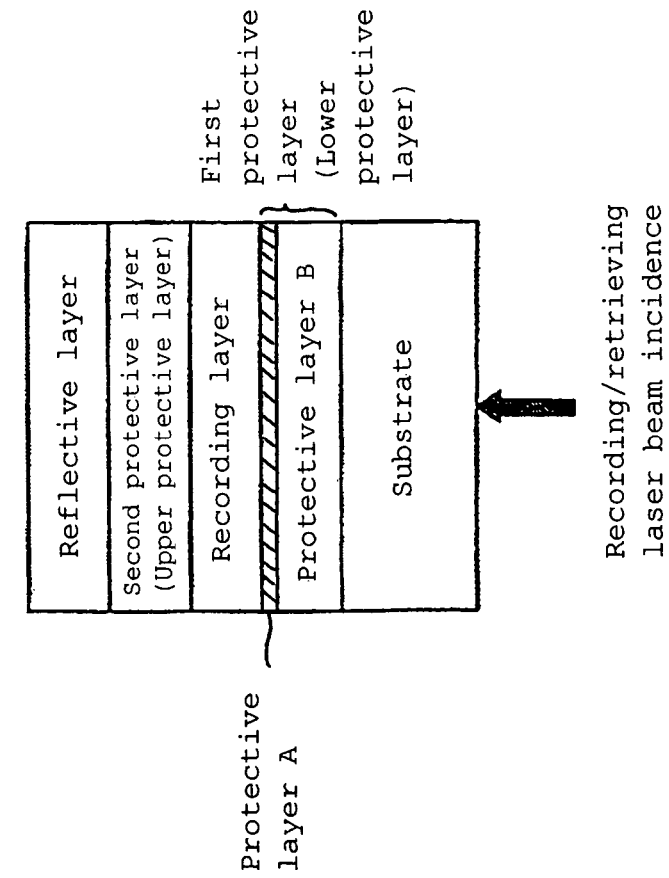

PHASE-CHANGE RECORDING MATERIAL AND INFORMATION RECORDING MEDIUM

TECHNICAL FIELD

The present invention relates to a phase-change recording material and an information recording medium employing it.

BACKGROUND ART

As a recording method utilizing the phase change, a method has been known wherein the crystal structure of a metal or a semiconductor is reversibly changed by affecting energy beams or an energy flow such as light or electric current (Joule heat) (Appl. Phys. lett., Vol. 18 (1971), pp. 254–257, U.S. Pat. No. 3,530,441).

Used practically at present as a means for recording on an information recording medium employing a phase-change type recording material, is a means to utilize a reversible change between the crystalline phase and the amorphous phase. Specifically, it is a means to let the crystalline state in a non-recorded/erased state and to form amorphous marks at the time of recording. Usually, a recording layer is locally heated to a temperature higher than the melting point and then rapidly cooled to form amorphous marks. On the other hand, the recording layer is heated at a temperature of approximately at most the melting point and at least the crystallization temperature, and slowly cooled so that the recording layer is kept at a temperature of at most the crystallization temperature for a certain retention time to carry out recrystallization. Namely, in general, a reversible change between the stable crystalline phase and the amorphous phase is utilized, and the information is recorded or retrieved by detecting the difference in physical parameters such as refractive index, electric resistance, volume and change in density, between the crystalline state and the amorphous state.

On the optical information recording medium among information recording mediums, recording and retrieving is carried out by utilizing a change in the reflectivity accompanying the reversible change between the crystalline state and the amorphous state caused locally by irradiation with a focused light beam. Such an optical information recording medium having a phase-change type recording layer is being developed and used practically as a low cost large capacity recording medium excellent in portability, weather resistance, impact resistance, etc. For example, a rewritable phase-change type optical information recording medium (hereinafter a phase-change type optical information recording medium may sometimes be referred to simply as "phase-change type optical disk", "optical disk" or "disk") such as CD-RW, DVD-RW, DVD+RW and DVD-RAM is widely used. Further, it has been developed to achieve a high density by the use of blue laser or by an increase in NA of an objective lens, or to make high speed recording possible by improvement of the recording pulse waveform.

As a material for such a phase-change type recording layer, a chalcogenide alloy is used in many cases. As such a chalcogenide alloy, a Ge—Sb—Te type, In—Sb—Te type, Ge—Sn—Te type or Ag—In—Sb—Te type alloy may, for example, be mentioned. Such an alloy is usually an overwritable material also.

Here, overwriting is a means wherein when recording is carried out again on a once-recorded medium, writing is carried out without erasing before the recording, that is, a means of recording while erasing. On a phase-change type optical information recording medium, recording is carried out usually by overwriting, and accordingly recording while erasing (i.e. overwriting) may sometimes be referred to simply as recording.

In recent years, along with increase in the amount of information, it has been desired to develop an information recording medium (particularly optical information recording medium) on which recording, erasing and retrieving at a higher speed are possible. As a material capable of satisfying both characteristics of excellent jitter characteristics and storage stability of amorphous marks even in such very high speed recording, a material containing as the main component a ternary composition of Sb—Ge—In is mentioned (JP-A-2001-39031, JP-A-2002-347341). This material is promising as a material to be used for a phase-change type optical disk on which high speed recording and erasing of information signals are carried out at a reference clock period of at most 15 ns.

DISCLOSURE OF THE INVENTION

However, there is such a problem that repeated recording durability of the above material containing as the main component a ternary composition of Sb—Ge—In has to be further increased.

For example, CD-RW is guaranteed to have repeated recording durability for 1000 times in many cases (to insure the repeated recording 1000 times, it is required that repeated recording about 2000 times is possible on CD-RW). On the other hand, of CD-RW employing the above ternary composition of Sb—Ge—In as the recording material, when the number of repeated recording is evaluated from a practical viewpoint, the upper limit of the number of repeated recording may be about 1000 times in some cases.

The present invention has been made to overcome the above problems, and the object is to provide a phase-change recording material on which high speed recording/erasing speed is possible, which has excellent jitter characteristics, which has a high storage stability of the recording signals, and which is excellent in repeated recording durability, and an information recording medium employing the above material. Particularly, it is to provide an optical information recording medium which is one mode of the applications of the information recording medium.

Under these circumstances, the present inventors have conducted extensive studies and as a result, found that by adding at least either lanthanoid or Te to the above ternary composition, both characteristics of jitter characteristics against high speed recording/erasing and storage stability of the recording signals are satisfied, and further the repeated durability is remarkably improved, and achieved the present invention.

Namely, the present invention is characterized by having the following gists.

1. A phase-change recording material characterized by containing a composition represented by the following formula (1) as the main component:

$$\{(Sb_{1-x}Ge_x)_{1-y}In_y\}_{1-z-w}M_zTe_w \qquad (1)$$

wherein x, y, z and w are numbers satisfying $0.001 \leq x \leq 0.3$, $0 \leq y \leq 0.4$, $0 \leq z \leq 0.2$ and $0 \leq w \leq 0.1$, and M is at least one element selected from lanthanoids, provided that z and w are not 0 at the same time.

2. The phase-change recording material according to the above 1, wherein in the above formula (1), $0 < z$.

3. The phase-change recording material according to the above 1 or 2, wherein in the above formula (1), z/y is at least 0 and at most 1.

4. The phase-change recording material according to any one of the above 1 to 3, wherein of the above phase-change recording material, the crystalline state corresponds to a non-recorded state and the amorphous state corresponds to a recorded state.
5. An information recording medium having a recording layer, characterized in that the above recording layer contains a composition represented by the following formula (1) as the main component:

$$\{(Sb_{1-x}Ge_x)_{1-y}In_y\}_{1-z-w}M_zTe_w \qquad (1)$$

wherein x, y, z and w are numbers satisfying $0.001 \leq x \leq 0.3$, $0 \leq y \leq 0.4$, $0 \leq z \leq 0.2$ and $0 \leq w \leq 0.1$, and M is at least one element selected from lanthanoids, provided that z and w are not 0 at the same time.
6. The information recording medium according to the above 5, wherein in the above formula (1), $0<z$.
7. The information recording medium according to the above 5 or 6, wherein in the above formula (1), z/y is at least 0 and at most 1.
8. The information recording medium according to any one of the above 5 to 7, wherein of the above phase-change recording medium, the crystalline state corresponds to a non-recorded state and the amorphous state corresponds to a recorded state.
9. The information recording medium according to any one of the above 5 to 8, wherein the above information recording medium is an optical information recording medium.
10. The information recording medium according to the above 9, wherein the above optical information recording medium further has a protective layer.
11. The information recording medium according to the above 9 or 10, wherein the above optical information recording medium further has a reflective layer, and the reflective layer contains Ag as the main component.

EFFECTS OF THE INVENTION

According to the present invention, a phase-change recording material on which high speed recording/erasing is possible, which has excellent recording characteristics, which has a high storage stability of the recording signals, and which is excellent in repeated recording durability, and an information recording medium employing the above material, can be obtained.

BRIEF DESCRIPTION OF THE DRAWINGS

FIG. 2 is schematic views illustrating the power pattern of a recording laser beam in a recording method of an optical information recording medium.
FIG. 5 is a schematic view illustrating the structure of one cell of a non-volatile memory.
FIG. 6 is schematic views illustrating the layer structure of an optical information recording medium.

EXPLANATION OF NUMERICAL REFERENCES

Figure 1A:
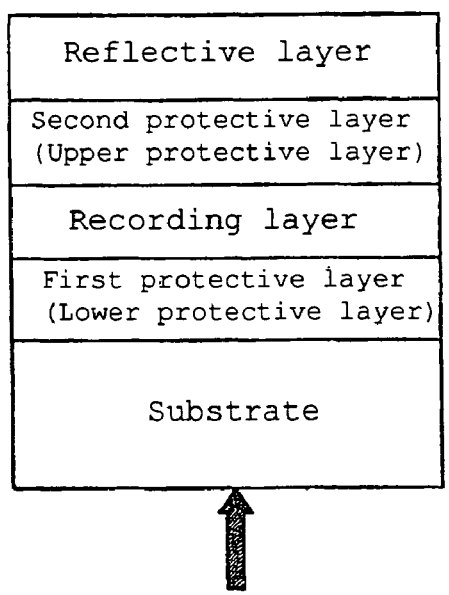
FIG. 1 is schematic views illustrating a layer structure of an optical information recording medium.

1 Upper electrode
2 Lower electrode
3 Phase-change recording layer
4 Heater portion
5 Reversibly changeable region
10 Insulating film

BEST MODE FOR CARRYING OUT THE INVENTION

Now, the embodiments of the present invention will be explained in detail. However, the present invention is not limited to the following embodiments, and various modifications are possible within the range of the gists.

[1] Phase-Change Recording Material

The phase-change recording material of the present invention contains a composition represented by the following formula (1) as the main component:

$$\{(Sb_{1-x}Ge_x)_{1-y}In_y\}_{1-z-w}M_zTe_w \qquad (1)$$

wherein x, y, z and w are numbers satisfying $0.001 \leq x \leq 0.3$, $0 \leq y \leq 0.4$, $0 \leq z \leq 0.2$ and $0 \leq w \leq 0.1$, and M is at least one element selected from lanthanoids, provided that z and w are not 0 at the same time. Further, each of x, y, z and w is an atomicity ratio.

The phase-change recording material of the present invention is characterized in that at least either lanthanoid or Te is added in a predetermined proportion to the specific composition of Sb—Ge—In type. The phase-change recording material of the present invention has such effects that it is excellent in the repeated recording durability, in addition to the jitter characteristics and the storage stability of the recording signals.

It has already been disclosed by one of the present inventors that the Sb—Ge—In type alloy is such a recording material that it is stable in either crystalline or amorphous state, and the phase change between these states at a relatively high speed is possible, and that an optical information recording medium having a recording layer employing the Sb—Ge—In type alloy in a specific composition exhibits excellent jitter characteristics and storage stability of the recording signals (JP-A-2001-39031). With respect to the above points, the present inventors have found that the Sb—Ge—In type alloy is excellent as a phase-change recording material as follows.

Namely, since the crystallization speed of Sb is high, amorphous marks cannot be formed under the recording conditions which are employed for common optical disks, however, the crystallization speed becomes low when Ge is mixed with Sb. Accordingly, by mixing Ge with Sb, the crystallization speed can be adjusted to achieve a recordable crystallization speed.

However, in an optical information recording medium having a recording layer employing a composition having Ge mixed with Sb, the jitters of the recorded signal tend to be significant. Accordingly, a phase-change recording material having Ge mixed with Sb is problematic for practical use. In fact, a phase-change type recording material of Sb—Ge type alloy has been discussed in literatures such as Appl. Phys. Lett. 60 (25), 22 Jun. 1992, pp. 3123 to 3125. However, the present inventors have conducted recording on an optical disk employing the Sb—Ge type alloy for the recording layer under general recording conditions and conducted evaluation and as a result, although recording on the optical disk was possible, the jitters of the recording signal were significantly high, and the optical disk was not practicable. Accordingly, as a result of further studies, the present inventors have found that by adding an appropriate amount of In to the above Sb—Ge type alloy, the jitter characteristics of the recording signals become favorable, and found that the composition of a Sb—Ge—In type alloy is favorable as the phase-change recording material.

However, as a result of further studies by the present inventors, it was found that of the phase-change recording material having a composition of a Sb—Ge—In type alloy, the crystallization speed tends to gradually decrease as compared with the initial one by carrying out repeated recording. Namely, repeated recording is carried out several thousands times on the phase-change recording material having a composition of a Sb—Ge—In type alloy, due to the above decrease in the crystallization speed, previously recorded amorphous marks are not adequately erased. Thus, the jitter characteristics tend to deteriorate due to the insufficient erasure of the amorphous marks. This tendency is remarkable when the In content is high.

The present invention has been made particularly to overcome the above tendency, and makes it possible to increase the repeated recording durability (for example, the jitter characteristics when repeated recording is carried out) by adding at least either lanthanoid or Te in a specific composition. The reason why the repeated recording durability improves by addition of such a metal element is not clearly understood, but is supposed as follows.

Namely, in the phase-change recording material having a composition of a Sb—Ge—In type alloy, in a case where a quick change in the temperature occurs by the repeated recording, a phenomenon similar to segregation may occur in some cases. If the segregation occurs, the crystallization speed tends to be low, and thus previously recorded amorphous marks may not be erased and remain in some cases. By the presence of a portion in which the amorphous marks are not erased, the jitter characteristics tend to deteriorate. It is supposed that by adding at least either lanthanoid or Te in a specific composition to the Sb—Ge—In type phase-change recording material, segregation is less likely to occur even if repeated recording is carried out, and such a phenomenon that the crystallization speed becomes low due to the repeated recording is less likely to occur. It is estimated that an optical information recording medium employing as the recording layer a phase-change recording material having at least either lanthanoid or Te added in a specific composition to the Sb—Ge—In type phase-change recording material (such as CD-RW) can maintain the initial crystallization speed even after repeated recording about 2000 times.

In the present invention, "containing a predetermined composition as the main component" means that the content of the above predetermined composition is at least 50 atomic % based on the entire materials or the entire layer in which the predetermined composition is contained. In order to further obtain the effect of the present invention, the above predetermined composition is contained in an amount of preferably at least 80 atomic %, more preferably at least 90 atomic %, particularly preferably at least 95 atomic %.

Further, in the present invention, it is preferred that of the phase-change recording material, the crystalline state corresponds to a non-recorded state and the amorphous state corresponds to a recorded state. This is because it is supposed that not many crystal nuclei are present in the phase-change recording material of the present invention. That is, in a case where the amorphous state corresponds to a non-recorded state and crystalline state marks are formed in this amorphous state, it is preferred to use a phase-change recording material in which many crystal nuclei are present. This is because when a large number of crystal nuclei are present in the phase-change recording material, the shape of the crystalline state marks is less likely to be influenced by the position of the crystal nuclei. On the other hand, as described above, not many crystal nuclei are present in the phase-change recording material of the present invention, and accordingly favorable recording is likely to be carried out when the crystal state corresponds to a non-recorded state and amorphous state recording marks are formed in the crystalline state, rather than when the amorphous state corresponds to a non-recorded state and crystalline state recording marks are formed in the amorphous state.

In order that the phase-change recording material of the present invention realizes excellent repeated recording durability in addition to the jitter characteristics and the storage stability of the recording signals, it is necessary that the respective metal elements as the main component are used in a specific composition. Detailed explanation will be made below.

(Sb, Ge)

The Ge amount based on the total amount of Sb and Ge, i.e. x in the above formula (1) is at least 0.001 and at most 0.3. Ge has a function to reduce the crystallization speed, to facilitate formation of an amorphous phase and to increase the storage stability of the amorphous phase. Accordingly, if the Ge content is low, the crystallization speed tends to be too high, whereby it becomes difficult to form the amorphous phase, or the storage stability of the amorphous phase tends to be insufficient in some cases. Accordingly, it is required that Ge is contained in a predetermined amount or more, and thus $0.001 \leq x$ in the above formula (1). Preferably $0.005 \leq x$, more preferably $0.01 \leq x$, furthermore preferably $0.02 \leq x$, particularly preferably $0.03 \leq x$.

On the other hand, if the Ge content is too high, the crystallization speed tends to be too low, and the erasure of the amorphous marks (crystallization) may not be carried out in some cases. Accordingly, in the above formula (1), $x \leq 0.3$. With a view to controlling the crystallization speed favorably, it is preferred that $x \leq 0.25$, more preferably $x \leq 0.2$, furthermore preferably $x \leq 0.15$, particularly preferably $x \leq 0.1$.

(In)

When In is contained, the signal amplitude tends to be high, and such an effect can be obtained that the jitter characteristics is improved. If the content is too low, the improving effect may not be obtained in some cases, and thus y indicating the content of In in the above formula (1) is $0 \leq y$. Preferably $0 \leq y$, more preferably $0.01 \leq y$, furthermore preferably $0.05 \leq y$, particularly preferably $0.1 \leq y$, most preferably $0.15 \leq y$. On the other hand, if the In content is too high, an In—Sb type stable crystalline phase having a low reflectivity. (low reflectivity crystalline phase) may be always formed other than the crystalline phase to be used for recording in some cases, and in such a case, a phase change does not occur at all and recording cannot be carried out. Accordingly, y indicating the In content in the above formula (1) is $y \leq 0.4$, preferably $y \leq 0.35$, more preferably $y \leq 0.3$, furthermore preferably $y \leq 0.25$, particularly preferably $y \leq 0.2$. Further, the optimum recording power tends to be low when the In content is high, and thus the above range is preferred.

(Lanthanoid)

The content of the lanthanoid is at least 0 and at most 0.2 in the above formula (1). Namely, z indicating the content of the lanthanoid in the above formula (1) is $0 \leq z \leq 0.2$.

In a case where a lanthanoid is contained, the decrease in the crystallization speed due to the repeated recording is suppressed. In order to obtain this effect, in a case where Te is not contained, $0<z$ in the above formula (1). Also with a view to suppressing the decrease in the crystallization speed due to the repeated recording, it is preferred that $0<z$, more preferably $0.005 \leq z$, furthermore preferably $0.01 \leq z$, particularly preferably $0.02 \leq z$. The lanthanoid is supposed to have a role to increase the crystallization speed of the phase-change recording material when the repeated recording is carried out. Accordingly, it is supposed that when a lanthanoid is added to the phase-change recording material having the composition of the Sb—Ge—In type alloy of which the crystallization speed tends to be low by the repeated recording, the decrease in the crystallization speed due to the repeated recording will be suppressed. As mentioned above, the lanthanoid has a role to increase the crystallization speed of the phase-change recording material at the time of repeated recording, and thus if the amount of the lanthanoid is large, the crystallization speed may become higher than initial one by the repeated recording in some cases.

On the other hand, if the content of the lanthanoid is too high, the initial crystallization tends to be difficult, the initial crystallization speed tends to be too low, or the signal amplitude tends to be low. Accordingly, in the above formula (1), $z \leq 0.2$, and it is preferably $z \leq 0.15$, more preferably $z \leq 0.1$, furthermore preferably $z \leq 0.07$. As compared with a case where Te is added as mentioned hereinafter, the decrease in the signal amplitude is small when a lanthanoid is added, and thus addition of a lanthanoid is preferred from this viewpoint.

A lanthanoid represents 15 elements of La, Ce, Pr, Nd, Pm, Sm, Eu, Gd, Tb, Dy, Ho, Er, Tm, Yb and Lu. Such lanthanoids are a series in which the 4f orbital is sequentially filled in view of the electron configuration and have similar properties, and are preferred. Among these lanthanoids, preferred is at least any of Eu, Gd, Tb, Dy, Ho, Er, Tm, Yb and Lu, and more preferred is Gd or Tb. By using the above lanthanoid, the change in the crystallization speed at the time of repeated recording can be suppressed. The lanthanoid may be used alone or in combination as a mixture of at least two.

(Te)

The Te content is at least 0 and at most 0.1 in the above formula (1). Namely, w indicating the Te content in the above formula (1) is $0 \leq w \leq 0.1$.

Also in a case where Te is added, the decrease in the crystallization speed due to the repeated recording is suppressed. In order to obtain this effect, in a case where no lanthanoid is contained, $0<w$ in the above formula (1). Also with a view to suppressing the decrease in the crystallization speed due to the repeated recording, it is preferably $0<w$, more preferably $0.005 \leq w$, furthermore preferably $0.01 \leq w$, particularly preferably $0.02 \leq w$.

On the other hand, the reflectivity of the medium and the signal amplitude tend to be low by addition of Te, and thus in the above formula, $w \leq 0.1$, and it is preferably $w \leq 0.09$, more preferably $w \leq 0.08$, furthermore preferably $w \leq 0.07$, particularly preferably $w \leq 0.06$.

(Relation Between In and Lanthanoid)

Of the phase-change recording material of the present invention, the decrease in the crystallization speed due to the repeated recording tends to be significant if the In content in the phase-change recording material is high. On the other hand, the crystallization speed due to the repeated recording tends to be high if the content of the lanthanoid in the phase-change recording material is high. Accordingly, in order to reduce the change in the crystallization speed due to the repeated recording, it is preferred to control the relation of In and lanthanoid contents.

From such a viewpoint, z/y in the above formula (1) is usually at least 0, and it is preferably at least 0.001, more preferably at least 0.01, furthermore preferably at least 0.05, particularly preferably at least 0.1, most preferably at least 0.15. The change in the crystallization speed at the time of repeated recording can be made small within this range.

Further, z/y in the above formula (1) is preferably at most 1, more preferably at most 0.7, furthermore preferably at most 0.5, particularly preferably at most 0.3, most preferably at most 0.25. Within this range, not only the initial crystallization (initialization carried out for the first time after production of an information recording medium) can be carried out favorably, but also the signal amplitude can be maintained high.

(Relation of In and Te)

With respect to the phase-change recording material of the present invention, the signal amplitude tends to decrease when Te is contained. Accordingly, in a case where Te is contained, favorable signal amplitude can be obtained by incorporating In in a large amount. Accordingly, the ratio of the In content (atomic %) to the Te content (atomic %) is preferably (In content)>(Te content), more preferably (In content)>1.5×(Te content), furthermore preferably (In content)>2×(Te content), particularly preferably (In content) >3×(Te content), most preferably (In content)>3.5×(Te content). On the other hand, with a view to securing the signal amplitude, usually (In content)<70×(Te content), preferably (In content)<30×(Te content).

(Relation Between Lanthanoid and Te)

To the phase-change recording material of the present invention, at least either lanthanoid or Te is added. Namely, either lanthanoid or Te may be used, or both may be used as combined. Such an effect that the decrease in the crystallization speed due to the repeated recording is suppressed can be obtained by addition of such an element, and in order to more securely obtain such an effect, z+w is preferably at least 0.01, more preferably at least 0.02. On the other hand, if lanthanoid or Te is contained excessively, the signal amplitude may decrease, or the initial crystallization may be difficult in some cases. Accordingly, z+w is usually at most 0.3, and it is preferably at most 0.25, more preferably at most 0.2, furthermore preferably at most 0.15, particularly preferably at most 0.1.

The lanthanoid has such properties that it increases the crystallization speed of the phase-change recording material during the repeated recording. Accordingly, by addition of the lanthanoid, the decrease in the crystallization speed due to the repeated recording of the composition of the Sb—Ge—In type alloy will be suppressed. On the other hand, if the lanthanoid is contained in an excessively large amount, the initial crystallization tends to be difficult.

Te makes it possible to suppress the decrease in the crystallization speed of the phase-change recording material due to the repeated recording. On the other hand, if Te is contained in an excessively large amount, the reflectivity of the medium and the signal amplitude tend to be low.

As mentioned above, the lanthanoid and Te have an effect to suppress the decrease in the crystallization speed of the phase-change recording material due to the repeated recording, and on the other hand, they have different properties to make the initial crystallization difficult and to reduce the reflectivity of the medium and the signal amplitude, respectively. Accordingly, when the lanthanoid and Te are used together and their contents are controlled within the above range, the initial crystallization can be carried out favorably and the reflectivity of the medium and the signal amplitude can be made favorable, while suppressing the decrease in the crystallization speed of the phase-change recording material due to the repeated recording.

Accordingly, in the present invention, it is preferred to use the lanthanoid and Te together.

(Other Matters)

The recording/erasing is carried out usually by irradiating the recording layer with a laser beam spot radiated from the light irradiation portion while rotating the medium at a high speed, and relatively moving the light irradiation portion and the medium at a high speed. The case where the relative speed of movement is high is referred to as a state where the recording linear velocity (recording velocity) is high, and the case where the relative speed of movement is low is referred to as a state where the recording linear velocity (recording velocity) is low.

In a state where the recording linear velocity is high, after the recording layer is once heated by the laser beam spot, it is rapidly cooled. Namely, the temperature history of the recording layer is in a quenching manner, and the higher the recording linear velocity, the more the amorphous phase is likely to be formed, and the less the crystalline phase is likely to be formed, on the recording layer having the same composition.

Accordingly, it is preferred to adjust the amounts of Ge, In and the lanthanoid within the above ranges of the contents depending upon the recording linear velocity, for example, to increase the crystallization speed in a medium of which the desired recording linear velocity is higher, and to reduce the crystallization speed in a medium of which the desired recording linear velocity is low.

In order to improve various characteristics, Au, Ag, Al, Ga, Zn, Sn, Si, Cu, Mn, Pd, Pt, Rh, Pb, Cr, Co, Mo, W, Mn, O, N, Se, V, Nb, Ta, Ti, Bi or the like may be added to the phase-change recording material as the case requires. In order to obtain the effect of improving the characteristics, the addition amount is preferably at least 0.1 at. % (atomic %) of the entire composition of the alloy. However, it is preferably at most 10 at. % so as not to impair the preferred characteristics of the composition of the present invention.

[2] Information Recording Medium

Now, the information recording medium of the present invention will be explained below.

The information recording medium of the present invention is an information recording medium having a recording layer and is characterized in that the recording layer has the composition represented by the following formula (1) as the main component:

(1)

wherein x, y, z and w are numbers satisfying $0.001 \leq x \leq 0.3$, $0 \leq y \leq 0.4$, $0 \leq z \leq 0.2$ and $0 \leq w \leq 0.1$, and M is at least one element selected from lanthanoids, provided that z and w are not 0 at the same time.

In the present invention, the information recording medium is preferably such that the crystalline state corresponds to a non-recorded state, and the amorphous state corresponds to a recorded state. This is because it is estimated that not many crystal nuclei are present in the recording layer composition of the present invention. Namely, in a case where the amorphous state corresponds to a non-recorded state and crystalline state marks are formed in the amorphous state, it is preferred to use a recording layer composition in which many crystal nuclei are present. This is because when a large number of crystal nuclei are present in the recording layer, the shape of the crystalline state marks is less likely to be influenced by the position of the crystal nuclei. On the other hand, as described above, not many crystal nuclei are present in the recording layer composition of the present invention, and accordingly favorable recording is likely to be carried out when the crystal state corresponds to a non-recorded state and amorphous state recording marks are formed in the crystalline state, rather than when the amorphous state corresponds to a non-recorded state and crystalline state recording marks are formed in the amorphous state.

By using the composition presented by the above formula (1) as the recording layer, an information recording medium having excellent recording characteristics such as the jitter characteristics, the storage stability of the amorphous marks and the repeated recording durability even at an ultrahigh speed recording can be realized.

Such an information recording medium is not particularly limited so long as recording and retrieving of information are carried out by detecting the difference in physical parameters as between the crystalline state and the amorphous state, and an information recording medium detecting the difference in the reflectivity, the electrical resistance, the volume, the change in density or the like may, for example, be mentioned. Particularly, the information recording medium employing the phase-change recording material of the present invention is suitable for an application to an optical information recording medium utilizing a change in the reflectivity due to a reversible change between the crystalline state and the amorphous state caused by irradiation with a laser beam.

Further, the information recording medium of the present invention may be applied to an information recording medium utilizing a change in the electrical resistivity due to a reversible change between the crystalline state and the amorphous state utilizing Joule heat generated by the electric current flow.

Now, as one example of the information recording medium of the present invention, the specific structure of the optical information recording medium and the recording/retrieving method will be explained. Further, as another example of the information recording medium of the present invention, a case where the information recording medium of the present invention is used for an application other than the optical information recording medium will also be explained below.

[2-1] Optical Information Recording Medium (Layer Structure)

Figure 1B:
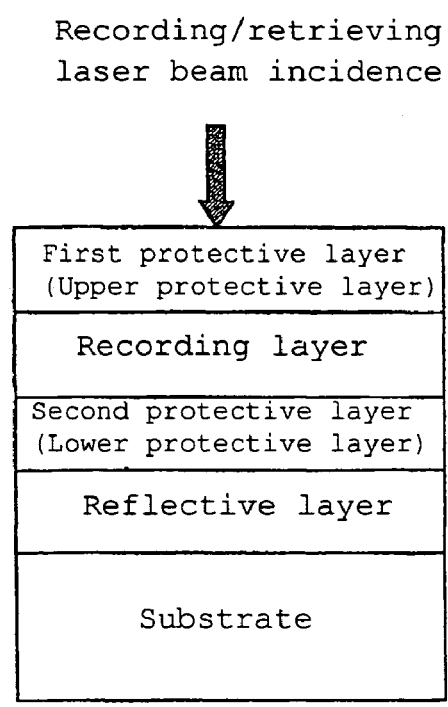

As the optical information recording medium, usually one having a multilayer structure as shown in FIG. 1(a) or FIG. 1(b) is employed. Namely, it is preferred that on a substrate, a recording layer having a composition represented by the above formula (1) as the main component is formed, and a protective layer is further formed, as evident from FIG. 1(a) and FIG. 1(b).

The more preferred layer structure of the optical information recording medium is such a structure that a first protective layer, a recording layer, a second protective layer and a reflective layer are formed in this order along the incident direction of the retrieving laser beam. Namely, in a case where the retrieving laser beam enters from the substrate side, preferred is a layer structure of a substrate, a first protective layer (lower protective layer), a recording layer, a second protective layer (upper protective layer) and a reflective layer (FIG. 1(a)), and in a case where the retrieving laser beam enters from the recording layer side, preferred is a layer structure of a substrate, a reflective layer, a second protective layer (lower protective layer), a recording layer and a first protective layer (upper protective layer) (FIG. 1(b)).

Needless to say, each layer may consists of at least two layers, and an interlayer may be formed between the respective layers. For example, between the substrate and the protective layer when the retrieving laser beam enters from the substrate side, or on the protective layer when the retrieving laser beam enters from the side opposite to the substrate, a translucent and extremely thin metal, semiconductor or dielectric layer having absorption, etc. may be formed so as to control the amount of the laser energy which enters the recording layer.

Further, a reflective layer is formed on the side opposite to the incident side of the recording/retrieving laser beam in many cases as mentioned above, but this reflective layer is not essential. Further, the protective layer which is preferably formed on at least one side of the recording layer may be made to have a multilayer structure with materials having different characteristics.

Now, the respective layers will be explained in detail.

(A) Recording layer (A-1) Materials Contained in Recording Layer and Their Amount The materials contained in the recording layer comprise a composition represented by the above formula (1) as the main component. This composition was already explained in detail, and the explanation is omitted here. In order to effectively obtain the effect of the present invention, the composition represented by the above formula (1) is contained usually in an amount of at least 50 atomic %, preferably at least 80 atomic %, more preferably at least 90 atomic %, particularly preferably at least 95 atomic %, based on the entire recording layer. The higher the content is, the more remarkably the effect of the present invention can be obtained. However, even if another component such as O or N is contained at the time of film formation of the recording layer, the effects of the present invention such as high speed recording/erasing can be obtained when the content is within a range of from several atomic % to 20 atomic %.

(A-2) Film Thickness of Recording Layer

The thickness of the recording layer is usually at least 1 nm, preferably at least 3 nm, more preferably at least 5 nm, particularly preferably at least 10 nm. With such a thickness, the contrast of the reflectivity between the crystalline state and the amorphous state will be adequate, and the crystallization speed will be adequate, whereby it will be possible to erase the record in a short time. Further, the reflectivity itself will be adequate. On the other hand, the thickness of the recording layer is usually at most 30 nm, preferably at most 25 nm, more preferably at most 20 nm, furthermore preferably at most 15 nm, still furthermore preferably at most 12 nm, particularly preferably at most 11 nm. With such a thickness, an adequate optical contrast will be obtained, and cracks are less likely to form on the recording layer. Further, no deterioration of the recording sensitivity due to increase in the thermal capacity will occur. Further, within the above film thickness range, the volume change due to the phase change can be moderately suppressed, and microscopic and irreversible deformation of the recording layer itself or the protective layer to be formed on or below the recording layer, which may cause noises when recording is repeatedly carried out, is less likely to be accumulated. Such accumulation of the deformation tends to decrease the repeated recording durability, and by bringing the film thickness of the recording layer to be within the above range, this tendency can be suppressed.

In a case where recording/retrieving is carried out by means of a focused laser beam of an object lens having a numerical aperture of from about 0.6 to about 0.65 from a LD (laser diode) having a wavelength of about 650 nm, such as rewritable DVD, or for a high density medium on which recording/retrieving is carried out by means of a focused laser beam of an object lens having a numerical aperture of from about 0.7 to about 0.85 from a blue LD having a wavelength of about 400 nm, the requirement against noises is more strict, and accordingly in such a case, the more preferred thickness of the recording layer is at most 25 nm.

(A-1) More Preferred Embodiment Regarding Recording Layer Film Thickness

In the present invention, it is considered that with respect to an optical information recording medium having a recording layer containing the composition represented by the above formula (1) as the main component, on which high speed recording/erasing is possible, by making the film thickness of the recording layer extremely thin, the recording characteristics at the second recording after the optical information recording medium is stored for a long time can be made favorable and the decrease in the reflectivity after the long term storage can be reduced. Specifically, it seems that by making the film thickness of the recording layer preferably at most 11 nm, of the optical information recording medium employing the recording layer having a composition represented by the above formula (1), the recording characteristics at the second recording after long term storage tend to be improved, and the decrease in the reflectivity after long term storage tend to be reduced.

Regarding the optical information recording medium employing the recording layer having a composition represented by the above formula (1), the jitter at the second recording after long term storage is somewhat poor in some cases. The reason is not necessarily clear, but is considered to relate to the tendency for the signal intensity at the first recording after the long term storage to be low. Namely, when recording is carried out after the optical information recording medium is stored for a long time, a signal amplitude at the first recording tends to be low. The signal amplitude recovers by further carrying out recording several times, and accordingly, the decrease in the signal amplitude at the first recording is considered to be caused by that the recording mark is less likely to be large when the crystalline portion after the long term storage is changed into an amorphous state for the first time. Further, the reason why the jitter is likely to deteriorate at the second recording after the long term storage is considered to be because a portion which is changed into an amorphous state for the first time after the long term storage (a portion which is not irradiated with a recording laser beam at the first recording) and a portion which is changed into an amorphous state again (for a second time) are both present. Namely, it is considered that there is a dispersion of the size of the amorphous marks due to the above presence of two phases in the second recording.

Further, the cause of the tendency for the amorphous marks to be less likely to be large at the time of the first recording after the long term storage is not clear, but is considered that a certain change occurs at the crystalline portion of the recording layer by the long term storage, since the characteristics recover after several recordings. By making the recording layer extremely thin (preferably at most 11 nm), the characteristics at the second recording after the long term storage are improved, and this is considered to be because the above change at the recording layer crystalline portion tends to be suppressed.

Further, by making the recording layer extremely thin (preferably at most 11 nm), the decrease in the reflectivity by the long term storage tends to be suppressed. The reason is not clear also, however, it is considered that the change of the recording layer after the long term storage is suppressed, similar to the improvement of the recording characteristics at the second recording after the long term storage.

However, if the recording layer is made extremely thin, the recording characteristics such as the signal amplitude may be impaired in some cases. However, regarding this point, the recording characteristics such as the signal amplitude can be brought to an adequately satisfactory level by adjusting the layer structure of the optical information recording medium and the film thickness.

Namely, in a case of the optical information recording medium wherein a protective layer, a recording layer having a composition represented by the above formula (1), a protective layer and a reflective layer are formed on a substrate in this order or in the opposite order, the signal intensity tends to be low when the film thickness of the recording layer is made extremely thin (thinner than about 12 nm for example). Accordingly, in a case where the recording layer is made extremely thin (at most 11 nm for example), a device is required to obtain a high signal intensity.

For example, one method is to change the film thickness of the protective layer located on the side from which the laser beam enters the recording layer. Namely, the film thickness of the protective layer is made thinner than the film thickness of the protective layer with which the reflectivity of the optical information recording medium reaches the minimum value. The film thickness at which the reflectivity reaches the minimum value varies depending upon the laser wavelength to be used, however, it is in the vicinity of 50 nm at the film thickness in the vicinity of 650 nm in DVD. By employing such a film thickness, the signal intensity becomes optically high.

However, it is known that when the film thickness of the protective layer on the laser beam incident side becomes thin, the thermal influence over e.g. the substrate tends to be significant, and the repeated recording durability tends to deteriorate in general. Accordingly, the above method of making the film thickness of the protective layer thin (in the vicinity of 50 nm for example) can be hardly employed. It is considered that an adequate repeated recording durability of an optical information recording medium can be obtained by employing a protective layer A (a protective layer containing a metal oxysulfide or a metal nitride) as described hereinafter for the entire protective layer or by employing the protective layer A as described hereinafter for the protective layer region of the protective layer which is in contact with the recording layer, even if the film thickness of the protective layer on the side from which the laser beam enters relative to the recording layer is made thin (at most 50 nm for example), against the above tendency. The details about the protective layer A will be explained below.

Under the above situation, the film thickness of the recording layer of the present embodiment is preferably at most 15 nm, more preferably at most 14 nm, furthermore preferably at most 13 nm, particularly preferably at most 12 nm, most preferably at most 11 nm.

On the other hand, as mentioned above, also in a case where the film thickness of the recording layer is made extremely thin in order to improve the recording characteristics after the long term storage, no adequate signal intensity can be obtained even by adjusting the layers other than the recording layer if the film thickness of the recording layer is excessively thin. The lower limit of the signal intensity depends on the performance of the retrieving apparatus, and in a case of rewritable DVD, the signal intensity tends to be low and the use tends to be difficult if the recording layer film thickness is less than 3 nm.

(A-4) Method for Producing Recording Layer

The above recording layer can be obtained by DC or RF sputtering of a predetermined alloy target in an inert gas, particularly in an Ar gas.

Further, the density of the recording layer is usually at least 80%, preferably at least 90% of the bulk density. As the bulk density $\rho$, an approximate value from the following mathematical formula (2) is usually employed, but it may be actually measured by preparing a mass having an alloy composition constituting the recording layer:

$$\rho = \Sigma m_i \rho_i \qquad (2)$$

wherein $m_i$ is the molar concentration of each element i, and $\rho_i$ is the atomic weight of the element i.

In the sputtering deposition method, the high energy Ar amount to be irradiated on the recording layer is increased by lowering the pressure of the sputtering gas (usually rare gas such as Ar, hereinafter explanation will be made with reference to the case of Ar) at the time of deposition, or by disposing the substrate in the vicinity of the front of the target, thereby to increase the density of the recording layer. The high energy Ar is usually either part of Ar ions to be irradiated on the target for sputtering which are bounced off and reach the substrate side, or the Ar ions in the plasma which are accelerated by the sheath voltage of the entire substrate face and reach the substrate.

Such an irradiation effect of the high energy rare gas is referred to as an atomic peening effect, and in the sputtering by an Ar gas which is commonly employed, Ar is incorporated into the sputtering film by the atomic peening effect. Accordingly, the atomic peening effect can be appraised by the Ar amount in the film. Namely, the small Ar amount indicates a small high energy Ar irradiation effect, and a film with a low density is likely to form.

On the other hand, if the Ar amount is large, irradiation of the high energy Ar tends to be intense, and the density of the film tends to be high. However, Ar incorporated in the film is likely to precipitate as a void at the time of repeated recording, and is likely to deteriorate the repeated recording durability. Accordingly, the discharge is carried out under an appropriate pressure, usually between the order of from $10^{-2}$ to $10^{-1}$ Pa.

Now, other constituting elements in the structure of the optical information recording medium which is the preferred embodiment of the present invention will be explained below.

(B) Substrate

As the substrate to be used in the present invention, a resin such as a polycarbonate, an acrylic resin or a polyolefin, or glass, or a metal such as aluminum may be employed. Usually guide grooves with a depth of a level of from 20 to 80 nm are formed on the substrate, and thus preferred is a substrate made of a resin on which the guide grooves can be formed by molding. Further, in the case of a so-called substrate face incidence (FIG. 1(a)) wherein the focused laser beam for erasing/retrieving the record enters from the substrate side, the substrate is preferably transparent.

The thickness of the substrate is usually at least 0.05 mm and at most 1.5 mm, however, one of about 1.2 mm for CD or one of about 0.6 mm for DVD is employed.

Further, in a case where the optical head of the laser has a high NA (at least about 0.7) and a short wavelength is employed to achieve a high density, in FIG. 1(b), a covering layer comprising a transparent resin is further formed on the protective layer on the laser beam incident side. As its thickness, usually a thin layer of from about 0.01 mm to about 0.1 mm may also be used.

(C) Protective Layer (C-1) General Explanation Regarding Protective Layer Used in the Present Invention In the present invention, in order to prevent evaporation and deformation due to the phase change of the recording layer, thereby to control the thermal diffusion at that time, it is preferred that the optical information recording medium further has a protective layer. The protective layer is usually formed on one or both sides of the recording layer, preferably on both sides. The material of the protective layer is determined taking into consideration the refractive index, the thermal conductivity, the chemical stability, the mechanical strength, the adhesive properties, etc. Usually, a dielectric such as an oxide, sulfide, nitride or carbide of a metal or semiconductor, having high transparency and high melting point, or a fluoride of Ca, Mg, Li or the like may be employed.

In this case, such an oxide, sulfide, nitride, carbide or fluoride may not necessarily take a stoichiometrical composition, and the composition may be controlled to adjust the refractive index, etc., and it is effective to use them as mixed. When repeated recording characteristics are taken into consideration, a mixture of dielectrics is preferred. More specifically, a mixture of ZnS or a chalcogen compound such as a rare earth sulfide with a heat resistant compound such as an oxide, nitride, carbide or fluoride may be mentioned. For example, a mixture of heat resistant compounds containing ZnS as the main component, or a mixture of heat resistant compounds containing an oxysulfide of the rare earth, particularly $Y_2O_2S$ as the main component is an example of the preferred protective layer composition.

As the material to form the protective layer, usually a dielectric material may be mentioned. The dielectric material may, for example, be an oxide of e.g. Sc, Y, Ce, La, Ti, Zr, Hf, V, Nb, Ta, Zn, Al, Cr, In, Si or Ge, a nitride of e.g. Ti, Zr, Hf, V, Nb, Ta, Cr, Mo, W, Zn, B, Al, Si, Ge or Sn, a carbide of e.g. Ti, Zr, Hf, V, Nb, Ta, Cr, Mo, W or Si, or a mixture thereof. Further, as the dielectric material, a sulfide, selenide or telluride of e.g. Zn, Y, Cd, Ga, In, Si, Ge, Sn, Pb, Sb or Bi, an oxysulfide of e.g. Y or Ce, a fluoride of e.g. Mg or Ca, or a mixture thereof, may be mentioned.

Further, as a specific example of the dielectric material, $ZnS$—$SiO_2$, $SiN$, $SiO_2$, $TiO_2$, $CrN$, $TaS_2$ or $Y_2O_2S$ may, for example, be mentioned. Among these materials, $ZnS$—$SiO_2$ is widely used in view of the high film deposition rate, the small film stress, the low rate of change of the volume due to the change in the temperature and the excellent weather resistance. In a case where $ZnS$—$SiO_2$ is used, the compositional ratio of ZnS to $SiO_2$ i.e. $ZnS:SiO_2$ is usually from 0:1 to 1:0, preferably from 0.5:0.5 to 0.95:0.05, more preferably from 0.7:0.3 to 0.9:0.1. Most preferably $ZnS:SiO_2$ is 0.8:0.2.

Taking the repeated recording characteristics into consideration, the film density of the protective layer is preferably at least 80% of the bulk state in view of the mechanical strength. In a case where a mixture of dielectrics is used, the theoretical density of the above-described mathematical formula (2) is employed as the bulk density.

The thickness of the protective layer is usually at least 1 nm and at most 500 nm in general. When it is at least 1 nm, the effect of preventing the deformation of the substrate or the recording layer can be secured, and a role as the protective layer can be fulfilled. Further, when it is at most 500 nm, while the role as the protective layer can be fulfilled, such a phenomenon can be prevented that the internal stress of the protective layer itself, the difference in the elastic characteristics with the substrate or the like will be remarkable, and thus cracks are formed.

Particularly when a first protective layer is formed, the first protective layer is required to suppress e.g. deformation of the substrate due to heat, and thus its thickness is usually at least 1 nm, preferably at least 5 nm, particularly preferably at least 10 nm. With such a thickness, accumulation of the microscopic deformation of the substrate during the repeated recording can be suppressed, and remarkable noise increase by scattering of the retrieving laser beam is less likely to occur.

On the other hand, the thickness of the first protective layer is preferably at most 200 m, more preferably at most 150 nm, furthermore preferably at most 100 nm, with relation to the time required for film formation. With such a thickness, the change of the groove shape of the substrate as viewed on the recording layer plane is less likely to occur. Namely, such a phenomenon that the depth or width of the grooves is smaller than the intended shape on the substrate surface is less likely to take place.

On the other hand, in a case where a second protective layer is formed, the thickness of the second protective layer is usually at least 1 nm, preferably at least 5 nm, particularly preferably at least 10 nm so as to suppress the deformation of the recording layer. Further, it is preferably at most 200 nm, more preferably at most 150 nm, furthermore preferably at most 100 nm, particularly preferably at most 50 nm, so as to prevent accumulation of the microscopic plastic deformation in the interior of the second protective layer which occurs due to the repeated recording and to suppress the noise increase due to the scattering of the retrieving laser beam.

The thicknesses of the recording layer and the protective layers are selected taking into consideration the interference effects attributable to the multilayer structure in addition to the restrictions from the viewpoint of the mechanical strength and reliability, so that the efficiency for absorption of the laser beam will be good, and the amplitude of recording signals, i.e. the contrast between the recorded state and the non-recorded state, will be large.

The protective layer may be constituted by a plurality of layers made of different materials as described above. Particularly, it is preferred to form an interfacial layer containing no sulfur or having a low sulfur content at the interface on the side which is in contact with the recording layer and/or at the interface on the side which is in contact with the reflective layer containing Ag as the main component.

The protective layer is produced usually by a known sputtering method.

(C-2) Preferred Embodiment of Protective Layer

It is preferred that the information recording medium used in the present invention has a protective layer A in contact with the recording layer employing the composition represented by the above formula (1) (hereinafter "the composition represented by the above formula (1)" may sometimes be referred to as "the predetermined composition"), and the protective layer A contains a metal oxysulfide or a metal nitride.

In a case where the information recording medium of the present invention is used as a phase-change type optical information recording medium, as the material of the protective layer, usually $(ZnS)_{80}(SiO_2)_{20}$ is used. This is because this material is excellent in transparency, the adhesive properties to a conventional recording layer, the sputtering rate, the cost, etc.

However, when the protective layer of the above $(ZnS)_{80}(SiO_2)_{20}$ is used for the recording layer having the predetermined composition on which high speed recording/erasing is possible, it seems that an object to further improve the repeated recording durability arises in some cases. It is considered that one cause is that a quick change in temperature is brought about in erasing the record of a medium for high speed recording, as compared with a medium for low speed recording. For example, in a case where the recording linear velocity doubles, the time to increase the temperature of the recording layer by irradiation with the laser beam will be ½, and further, the cooling rate tends to be high also. This is because the temperature distribution of the melted region of the recording layer is gentle when the recording is carried out at a low linear velocity, whereas it tends to be sharp when the recording is carried out at a high linear velocity. Further, the distance between the melted region and the laser beam tends to be relatively long in the recording at a high linear velocity as compared with the recording at a low linear velocity. Of course, as the cause of the above repeated recording durability not being adequate, a cause resulting from the recording layer material itself, such as a difference in properties regarding the substance movement due to the melting and solidification, or such a cause that the atomic diffusion of e.g. sulfur which is reported in the case of the combination with a conventional recording material is more likely to occur, may also be considered.

In the present invention, by forming a protective layer A containing GeN for example as the metal nitride or $Y_2O_2S$ for example as the metal oxysulfide in contact with the recording layer containing a recording layer material of the predetermined composition, further improvement of the repeated recording durability of the information recording medium can be expected. The reason why the improvement of the repeated recording durability can be expected by forming a protective layer A containing a metal nitride such as GeN or a metal oxysulfide such as $Y_2O_2S$ is not necessarily clear, but is considered to be because effects to suppress the deformation of the recording layer due to the quick change in the temperature by carrying out the high speed recording as compared with a conventional one, the substance movement in the recording layer, the atomic diffusion between the layers, can be obtained.

(1) Protective Layer A

In the present invention, it is preferred to incorporate a metal oxidesulfide or a metal nitride into the protective layer A in contact with the recording layer. Of course, a metal oxysulfide and a metal nitride may be used together. Now, explanation will be made in further detail.

(1-1) Protective Layer A Containing Metal Oxysulfide

In the present invention, it is preferred to use the protective layer A containing a metal oxysulfide. Containing a metal oxysulfide means that the constituting element in the protective layer is present while maintaining the form of the metal oxysulfide.

In the present invention, it is expected that the durability when recording is carried out repeatedly on the information recording medium further improves by forming the protective layer A containing a metal oxysulfide in contact with the recording layer having the predetermined composition. The reason is not clearly understood yet, but is considered to be related with high thermal conductivity and hardness of the protective layer A containing a metal oxysulfide and high uniformity of the distribution of the constituting element. Namely, the protective layer A in the present invention has high thermal conductivity and hardness as compared with a protective layer employing a composite dielectric containing ZnS as the main component, as represented by a $ZnS$—$SiO_2$ film which has conventionally been commonly used. On the other hand, the refractive index of the protective layer A is usually from about 1.7 to about 2.4 although it depends on the compositional ratio, and is substantially the same as that of a protective layer employing a composite dielectric containing ZnS as the main component.

Further, it is considered that deformation of the recording layer due to thermal expansion tends to be small since the thermal conductivity of the protective layer A containing a metal oxysulfide is high. Namely, since the thermal conductivity of the protective layer A is high, the heat of the recording layer which is heated when the recording marks are formed by the laser can be let loose quickly. Accordingly, the difference in temperature between the interfacial region which is in contact with the recording layer of the protective layer A and the region of the protective layer A which is apart from the recording layer, or the difference in temperature between the mark-formed region and the peripheral region can be instantaneously dissolved. As a result, peeling of the film or occurrence of the cracks resulting from the difference in temperature can be suppressed. In other words, it is considered that the overwriting deterioration can be delayed. The thermal conductivity can be indirectly known from the value of the laser power when amorphous marks are formed on the prepared disk. Namely, the higher the thermal conductivity, the higher the laser power required to heat the recording layer tends to be. For example, in a case where a protective layer A containing a metal oxysulfide is used, the laser power required for mark formation tends to be high as compared with a case where a protective layer of $ZnS$:$SiO_2$=80:20 (mol %) is used. This is because the function of the protective layer A as a heat dissipation layer is increased due to a high thermal conductivity.

Further, the JIS Knoop hardness of the protective layer using $ZnS$:$SiO_2$=80:20 (mol %) is about 280, whereas the JIS Knoop hardness of the protective layer A using $Y_2O_2S$ for example as the metal oxysulfide is about 520. The protective layer A having a high hardness is important with a view to preventing the deformation of the recording layer. If the hardness is low, it is difficult to appropriately suppress the change in the volume of the recording layer due to recording/erasing, i.e. the deformation resulting from the difference in the volume between the amorphous state and the crystalline state, and the deformation is accumulated along with the increase in the number of the repeated overwriting, thus causing decrease in the signal intensity.

Further, in the protective layer A containing a metal oxysulfide, the metal atom is bonded to both sulfur and oxygen, and accordingly the mixing properties of sulfur with oxygen are so high and incomparable with a protective layer employing a mixture of a sulfide and an oxide such as $ZnS$—$SiO_2$ or $ZnS$—$Y_2O_3$. Accordingly, it is considered that the protective layer A has stably high characteristics since the dispersibility of sulfur, oxygen and metal atoms such as selenium atoms is high as compared with conventional $ZnS$—$SiO_2$. Accordingly, it is estimated that such a phenomenon that sulfur disperses from the protective layer to the recording layer during the repeated overwriting to cause a decrease in the reflectivity or a change in the crystallization speed is suppressed.

Further, in a case where the protective layer A containing a metal oxysulfide such as $Y_2O_2S$ is formed in contact with the recording layer having the predetermined composition to be used in the present invention, the signal amplitude of the information recording medium tends to be high as compared with a case where the protective layer A contains a metal nitride such as GeN. The reason is not clear, but such a reason that the properties of the crystal growth of the recording layer are slightly changed by the protective layer A in contact with the recording layer, and the size of the amorphous marks to be formed varies, may be considered. Such properties are considered to be determined by the combination of the recording layer material and the material of the protective layer A, and with respect to the conventional recording layer material, the change of the signal intensity by the material of the protective layer A has not attracted an attention.

As the metal element used for the metal oxysulfide, a rare earth metal element such as Sc, yttrium or a lanthanoid element such as La or Ce; or a transition metal element such as Ti may, for example, be mentioned. Among them, a rare earth metal element is preferred, and a rare earth metal element selected from the group consisting of yttrium and La, Ce, Nd, Sm, Eu, Gd, Tb and Dy is particularly preferred. The oxysulfide of yttrium ($Y_2O_2S$) is thermochemically more stable than $Y_2O_3$ or $Y_2S_3$ up to about 1000° C., and accordingly the most preferred element is yttrium.

The content of the metal oxysulfide in the protective layer A is preferably at least 5 mol %, more preferably at least 10 mol %, most preferably at least 15 mol %. If the content of the metal oxysulfide is too low, the overwriting characteristics may decrease in some cases. On the other hand, in view of the repeated overwriting characteristics etc., the content of the metal oxysulfide in the protective layer A is preferably as high as possible, and the content of the metal oxysulfide in the protective layer A may be at most 100 mol %.

Further, the content of the metal element constituting the metal oxysulfide in the protective layer A is usually at least 10 atomic %, preferably at least 20 atomic %, more preferably at least 25 atomic %. The content of the metal element constituting the metal oxysulfide is an index indicating the content of the metal oxysulfide in the protective layer A, and if the metal element is too small, the effect for further improving the overwriting characteristics may not be adequate in some cases. On the other hand, in view of the repeated overwriting characteristics, the content of the metal oxysulfide in the protective layer A is preferably as high as possible, and thus the upper limit of the content of the metal element constituting the metal oxysulfide is the content of the metal element when the protective layer A consists entirely of the metal oxysulfide.

Further, for the protective layer A, a metal oxysulfide and another material may be used together. Said another material is not particularly limited so long as it is a material which is commonly used for the protective layer. For example, a dielectric such as an oxide, sulfide, nitride or carbide of a metal or semiconductor, having high transparency and high melting point, or a fluoride of Ca, Mg, Li or the like, may be employed in general.

In this case, such an oxide, sulfide, nitride, carbide or fluoride may not necessarily take a stoichiometrical composition, and the composition may be controlled to adjust the refractive index, etc., and it is effective to use them as mixed. When repeated recording characteristics are taken into consideration, a mixture of dielectrics is preferred.

Further, as the material to be contained in the protective layer A, usually a dielectric material may be mentioned. As the dielectric material, an oxide of e.g. Sc, Y, Ce, La, Ti, Zr, Hf, V, Nb, Ta, Zn, Al, Cr, In, Si or Ge, a nitride of e.g. Ti, Zr, Hf, V, Nb, Ta, Cr, Mo, W, Zn, B, Al, Si, Ge or Sn, a carbide of e.g. Ti, Zr, Hf, V, Nb, Ta, Cr, Mo, W or Si, or a mixture thereof may, for example, be mentioned. Further, as the dielectric material, a sulfide, selenide or telluride of e.g. Zn, Y, Cd, Ga, In, Si, Ge, Sn, Pb, Sb or Bi, an oxysulfide of e.g. Y or Ce, a fluoride of e.g. Mg or Ca, or a mixture thereof may be mentioned.

More specifically, an oxide, sulfide, nitride, carbide or fluoride of a metal or semiconductor, as represented by zinc sulfide, zinc oxide, silicon oxide, silicon nitride, aluminum nitride, aluminum oxide, a rare earth oxide, a rare earth sulfide, a rare earth fluoride, magnesium fluoride, etc. may, for example, be mentioned. Among them, particularly preferred is a zinc compound such as zinc sulfide or zinc oxide, which is excellent in the adhesive properties with the recording layer. As a result, a more stable and higher durability can be obtained.

In a case where another material is contained in the protective layer A other than the metal oxysulfide, the content of the material is usually at most 99 mol %, preferably at most 90 mol %. On the other hand, it is usually at least 1 mol %, preferably at least 5 mol %.

However, the appropriate content varies depending upon the type of the material to be mixed. For example, in a case where zinc sulfide is used as the above material, its amount may be high, and it is usually at least 20 mol %, preferably at least 30 mol %, furthermore preferably at least 50 mol %, most preferably at least 60 mol %.

On the other hand, in a case where zinc oxide is used as the above material, a too high content tends to be unfavorable, and the content is usually at most 30 mol %, preferably at most 20 mol %, furthermore preferably at most 10 mol %. Further, the molar content of zinc oxide is preferably at most half the molar content of the metal oxysulfide.

As the particularly preferred composition of the protective layer A, a mixed composition containing $Y_2O_2S$ and ZnS may be mentioned. In this case, particularly excellent overwriting characteristics can be obtained. In this case, the molar ratio of ZnS to $Y_2O_2S$ is usually at least 1%, preferably at least 5%, more preferably at least 10%, and usually at most 1000%, preferably at most 700%, furthermore preferably at most 500%.

Further, it is possible to let zinc in the metal form be present in the protective layer A. However, it is contained preferably in the form of a zinc compound such as zinc oxide or zinc sulfide as described above.

In the present invention, the purity of the protective layer A (the content of the metal oxysulfide or the content of a mixture of the metal oxysulfide with another material in the protective layer A) is preferably at least 90 mol %. The purity is preferably as high as possible, however, the influence of impurities in an amount less than 10 mol % over the characteristics of the protective layer A is negligible. Particularly when the impurities are stable compounds, the bad influence tends to be small, however, if the amount of the impurities exceeds 10 mol %, there is high possibility that the physical property values such as the hardness or the stress of the film change, and the characteristics of the protective layer A may deteriorate.

The protective layer A containing a metal oxysulfide can be formed by deposition by means of a sputtering method using a target containing a metal oxysulfide. Usually, a target having a composition within a range substantially the same as the preferred composition of the protective layer A is used.

Namely, it is preferred to use one containing a metal oxysulfide as the target for sputtering. The type of the metal element of the metal oxysulfide to be used for the target is optionally selected according to the composition of the protective layer A.

Further, in a case where the protective layer A contains a metal oxysulfide and another protective layer material, a target of a mixture of the metal oxysulfide and the another material may be used in accordance with the composition of the another material to be used. Further, a target of the metal oxysulfide and a target of the above another material may be separately prepared, and they are subjected to sputtering at the same time.

The content of the metal oxysulfide in the target is usually at least 10 mol %, preferably at least 30 mol %, more preferably at least 50 mol %. If the content of the metal oxysulfide in the target is excessively low, the metal oxysulfide may be decomposed in the target, whereby the metal oxysulfide cannot be incorporated in the protective layer A in some cases. On the other hand, the content of the metal oxysulfide in the target varies depending upon the content of the above another protective layer material. However, in a case where a target comprising a metal oxysulfide simple substance is used, the content of the metal oxysulfide in the target is usually 100 mol %.

Whether or not the metal oxysulfide is contained in the target can be confirmed by measuring the X-ray diffraction of the target.

Further, the target containing a metal oxysulfide is produced usually by using a powder of the metal oxysulfide or a mixed powder of an oxide and a sulfide of the same metal, by using a known method such as hot pressing method. Preferred as the metal to be used is a rare earth or a metal element.

As the conditions for sputtering, known conditions may be employed.

For the analysis of the composition of the protective layer A, usually the composition may be identified by combination of e.g. Auger electron spectroscopy (AES), Rutherford back scattering (RBS), inductively-coupled plasma spectrometry (ICP) etc.

(1-2) Protective Layer A Containing Metal Nitride

In the present invention, it is also preferred to use a protective layer containing a metal nitride as the protective layer A.

A metal nitride tends to have a high thermal conductivity similar to the metal oxysulfide, and accordingly it is considered that the high thermal conductivity of the protective layer A suppresses peeling of the film or occurrence of the cracks resulting from the difference in temperature, and can delay deterioration of the overwriting, similar to the above case of one containing a metal oxysulfide as mentioned above.

As the metal to be used for the metal nitride, at least one element selected from the group consisting of Si, Ge, Al, Ti, Ta, Cr, Mo, Nb, Zr and Hf may, for example, be mentioned. The nitride of such an element is stable, and thus the storage stability of the information recording medium tends to improve. A plurality of the above elements may be used. Preferred as the above element is Si, Ge, Al or Cr which provides higher transparency and excellent adhesion properties.

In a case where one type of the above element is used, as the material formed by the above element and nitrogen, a nitride of the above element simple substance may be mentioned. More specifically, a composition in the vicinity of e.g. Si—N, Ge—N, Cr—N or Al—N may be mentioned. Among them, in view of higher effect for preventing diffusion into the recording layer, it is preferred to use Si—N (nitride of silicon), Ge—N (nitride of germanium) or Al—N (nitride of aluminum), and it is more preferred to use Ge—N (nitride of germanium).

In a case where at least two of the above elements are used, as the material formed by the above elements and nitrogen, a composite nitride of the above elements may be mentioned. As such a compound, as representative examples using Ge—N, one containing, together with Ge, e.g. Al, B, Ba, Bi, C, Ca, Ce, Cr, Dy, Eu, Ga, In, K, La, Mo, Nb, Ni, Pb, Pd, Si, Sb, Sn, Ta, Te, Ti, V, W, Yb, Zn or Zr, such as Ge—Si—N, Ge—Sb—N, Ge—Cr—N, Ge—Al—N, Ge—Mo—N or Ge—Ti—N may be mentioned.

The content of the metal nitride in the protective layer A is preferably at least 5 mol %, more preferably at least 10 mol %, most preferably at least 15 mol %. If the content of the metal nitride is too low, the overwriting characteristics may decrease in some cases. On the other hand, in view of the repeated overwriting characteristics etc., the content of the metal nitride in the protective layer A is preferably as high as possible, and the content of the metal nitride in the protective layer A may be at most 100 mol %.

Further, the content of the metal element constituting the metal nitride in the protective layer A is usually at least 10 atomic %. Preferably at least 20 atomic %, more preferably at least 25 atomic %. If the content of the metal nitride is too low, the effect for further improving the overwriting characteristics may not be adequate in some cases. On the other hand, in view of the repeated overwriting characteristics etc., the content of the metal nitride in the protective layer A is preferably as high as possible, and thus the upper limit of the content of the metal element constituting the metal nitride is the content of the metal element when the protective layer A consists entirely of the metal nitride.

Further, for the protective layer A, a metal nitride and another material may be used together. As the another material and its content, the same material as one explained for the protective layer A containing a metal oxysulfide may be employed.

In the present invention, the purity of the protective layer A (the content of the metal nitride or the content of a mixture of the metal nitride and another material in the protective layer A) is preferably at least 90 mol %. The purity is preferably as high as possible, however, the influence of impurities in an amount less than 10 mol % over the characteristics of the protective layer A is negligible. Particularly when the impurities are stable compounds, the bad influence tends to be small, however, if the amount of the impurities exceeds 10 mol %, there is high possibility that the physical property values such as the hardness or the stress of the film change, and the characteristics of the protective layer A may deteriorate.

The protective layer A containing a metal nitride can be formed by deposition by means of a sputtering method using a target containing a metal nitride. Further, the protective layer A may be formed also by a reactive sputtering method in which a slight amount of a mixed gas of Ar and $N_2$ is flown in a vacuum chamber, and under a predetermined vacuum pressure, a voltage is applied to a target comprising a predetermined metal (a metal element simple substance or a metal element composite in the metal nitride contained in the protective layer A) for discharge, and the ejected metal element simple substance or metal element composite is reacted with $N_2$ to convert it into a nitride for deposition. Here, it has to be noted that the transparency of the protective layer A is hardly secured if the nitrogen content in the protective layer A is excessively low, and the improvement of the repeated recording durability of the optical information recording medium tends to be insufficient if the nitrogen content is excessively high. Accordingly, in a case where the above reactive sputtering method is employed, it is important to adjust the nitrogen flow amount. Further, the pressure at the time of sputtering also has an influence over the film properties. Usually, by decreasing the pressure, the protective layer A can be formed densely.

For the analysis of the composition of the protective layer A, the composition can be identified usually by combination of Auger electron spectroscopy (AES), Rutherford back scattering (RBS), inductively-coupled plasma spectroscopy (ICP) etc.

(1-3) Film Thickness of Protective Layer A

The preferred range of the film thickness of the protective layer A varies depending upon the position at which the protective layer A is used.

Namely, in a case where the protective layer A is formed as the first protective layer, the first protective layer is required to suppress e.g. the deformation of the substrate due to heat, and its thickness is usually at least 1 nm, preferably at least 5 nm, particularly preferably at least 10 nm. With such a thickness, accumulation of the microscopic deformation of the substrate during the repeated recording can be suppressed, and a remarkable noise increase by scattering of the retrieving laser beam is less likely to occur.

On the other hand, the thickness of the first protective layer is preferably at most 200 nm, more preferably at most 150 nm, furthermore preferably at most 100 nm, with relation to the time required for film formation. With such a thickness, a change in the groove shape of the substrate as viewed on the recording layer plane is less likely to occur. Namely, such a phenomenon that the depth or width of the grooves is smaller than the intended shape on the substrate surface is less likely to take place.

In a case where the protective layer A is formed as the second protective layer, the thickness of the second protective layer is usually at least 1 nm, preferably at least 5 nm, particularly preferably at least 10 nm so as to suppress deformation of the recording layer. Further, in order to prevent accumulation of microscopic plastic deformation in the interior of the second protective layer which occurs along with the repeated recording, thereby to suppress the noise increase by scattering of the retrieving laser beam, it is preferably at most 200 nm, more preferably at most 150 nm, furthermore preferably at most 100 nm, particularly preferably at most 50 nm.

However, in the present invention, usually the protective layer A having a high thermal conductivity and having a high hardness is formed in contact with the recording layer, and accordingly the film thickness of the protective layer A located on the side from which the laser beam enters relative to the recording layer can be made thin, as explained in the above explanation for the recording layer. Namely, in a case where the protective layer A is formed in contact with the recording layer face on the side from which the laser beam enters, the film thickness of the protective layer A is preferably at most 50 nm.

The sputtering rate of the material containing e.g. a metal oxysulfide such as $Y_2O_2S$ as the main component, tends to be low as compared with the sputtering rate of a material such as $(ZnS)_{80}(SiO_2)_{20}$ which has conventionally been employed. Accordingly, with a view to increasing the productivity of the information recording medium, the protective layer A containing e.g. a metal oxysulfide may be formed relatively thinly in contact with the recording layer and a protective layer B may be formed in contact with the protective layer A. Further, a material which has conventionally been employed (e.g. $(ZnS)_{80}(SiO_2)_{20}$) may be used for the protective layer B. The details of the specific embodiment of such an information recording medium will be described hereinafter.

As mentioned above, in a case where the protective layer has a multilayer structure by using the protective layer A and the protective layer B, the film thickness of the protective layer A in the present invention is usually at least 0.1 nm, preferably at least 1 nm, more preferably at least 2 nm, furthermore preferably at least 3 nm, particularly preferably at least 5 nm. On the other hand, the film thickness of the protective layer A is usually at most 100 nm, preferably at most 50 nm, more preferably at most 25 nm, furthermore preferably at most 10 nm.

(1-4) Position of Protective Layer A and Recording Layer

In the present invention, it is preferred that the protective layer A containing a metal oxysulfide or a metal nitride is formed in contact with the recording layer. More preferably, the above predetermined protective layer A is formed on both sides of the recording layer. It is because the repeated overwriting characteristics can be further improved by forming the above predetermined protective layer A on both sides of the recording layer. In general, by forming the above predetermined protective layer A on both sides of the recording layer, the recording layer and the protective layer A tend to peel off, however, it is considered that the above problem of peeling is less likely to occur in the recording layer employing the predetermined composition of the present invention.

For example, if the protective layer A containing a metal oxysulfide such as $Y_2O_2S$ is formed in contact with a conventional recording layer of SbTe eutectic ($Sb_{70}Te_{30}$) composition, film peeling in an environment resistance test tends to occur. This tendency becomes more remarkable if the above protective layer A is formed on both sides of the recording layer. For example, with respect to a conventional recording layer employing a SbTe eutectic composition, if the protective layer A containing a metal oxysulfide such as $Y_2O_2S$ is formed in contact with both sides of the recording layer, film peeling occurs in an environment resistance test with high humidity, and the adhesive properties and the weather resistance of the film tend to be not necessarily sufficient.

(2) Protective Layer B

Figure 7A:
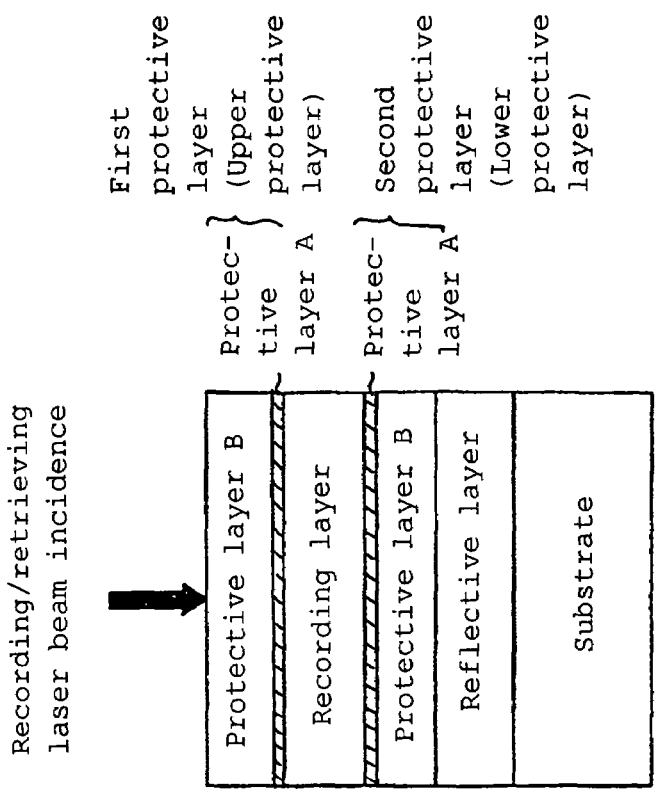
FIG. 7 is schematic views illustrating the layer structure of an optical information recording medium.
Figure 7B:
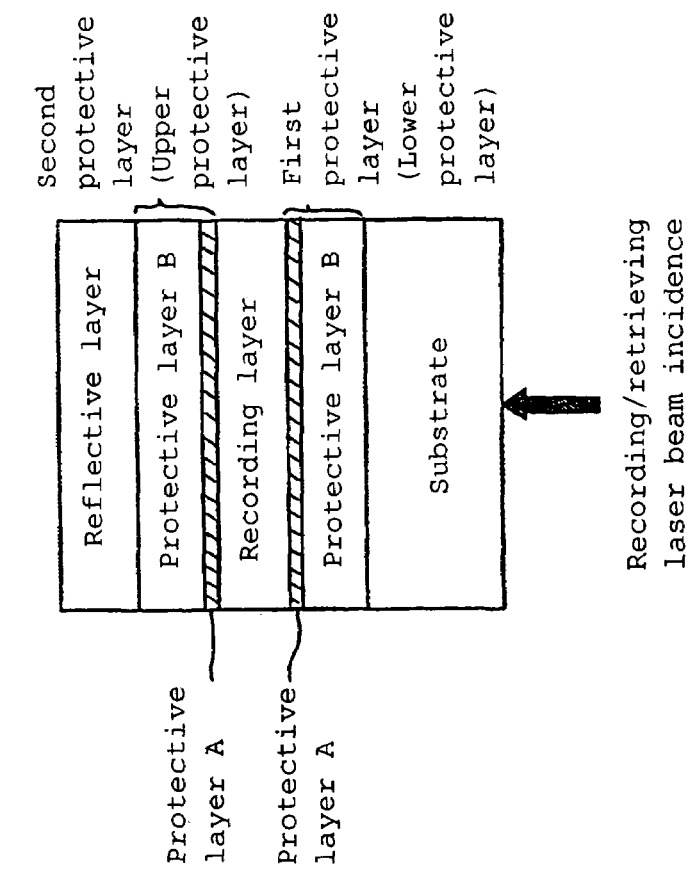

Another example of the preferred layer structure of the optical information recording medium is to make one or both of the first and second protective layers have a two-layer structure comprising the protective layer A and the protective layer B. In view of e.g. the repeated overwriting, it is preferred to make the first protective layer located on the laser beam incident side have a two-layer structure (FIGS. 6(a), 6(b)), and it is more preferred to make both the first and the second protective layers have a two-layer structure comprising the protective layer A and the protective layer B (FIGS. 7(a), 7(b)).

In the above preferred layer structure, the first protective layer or the second protective layer has a two-layer structure comprising the protective layer A and the protective layer B, however, the layer structure is not limited to such an embodiment so long as the protective layer A is formed in contact with the recording layer. For example, it may be optionally carried out to make the first protective layer or the second protective layer have a multilayer structure of at least three layers, by further forming a protective layer formed by another material in contact with the protective layer B.

(2-1) Material, Production Method etc. of Protective Layer B

As the material of the protective layer B, a material commonly used for the protective layer may optionally be used. Such a material has already been explained, and the explanation is omitted here. The protective layers A and B may be two layers comprising different materials, or they may have a gradient composition in which the respective components gradually change.

Further, as the method for producing the protective layer B, a production method commonly used for the protective layer may be used.

(2-2) Film Thickness of Protective Layer B

The protective layer B is in contact with the protective layer A, and plays a role as the protective layer in a two-layer structure of the protective layer A and the protective layer B. Accordingly, the film thickness of the protective layer B is a film thickness obtained by subtracting the film thickness of the protective layer A from the film thickness which is usually required for a protective layer.

However, in the present invention, the protective layer A usually having a high thermal conductivity and a high hardness is formed in contact with the recording layer, and accordingly the film thickness of the protective layer located on the side from which the laser beam enters relative to the recording layer (for example, the film thickness of the protective layer A in a case where the protective layer is formed only by the protective layer A, or the total film thickness of the protective layer A and the protective layer B in a case where the protective layer A and the protective layer B are laminated to form the protective layer) can be made thin, as explained in the above explanation for the recording layer.

Namely, the total of the film thickness of the protective layer A and the film thickness of the protective layer B is preferably at most 50 nm, in a case where the protective layer A is formed in contact with the recording layer face on the side from which the laser beam enters, and the protective layer B is further formed in contact with the protective layer A.

As mentioned above, in a case where the protective layer has a multilayer structure by using the protective layer A and the protective layer B, the film thickness of the protective layer A in the present invention is usually at least 0.1 nm, preferably at least 1 nm, more preferably at least 2 nm, furthermore preferably at least 3 nm, particularly preferably at least 5 nm. On the other hand, the film thickness of the protective layer A is usually at most 100 nm, preferably at most 50 nm, more preferably at most 25 nm, furthermore preferably at most 10 nm. Accordingly, the film thickness of the protective layer B is the rest obtained by subtracting the film thickness of the protective layer A from the total film thickness of the protective layer.

The thicknesses of the recording layer and the protective layers are selected taking into consideration the interference effects attributable to the multilayer structure in addition to restrictions from the viewpoint of the mechanical strength and reliability, so that the efficiency for absorption of the laser beam will be good, and the amplitude of recording signals, i.e. the contrast between the recorded state and the non-recorded state, will be large.

(D) Reflective Layer

In the optical information recording medium, a reflective layer may further be formed. In the present invention, it is preferred that the optical information recording medium further has a reflective layer with a view to increasing the heat dissipation properties of the recoding layer.

The position at which the reflective layer is formed usually depends at the incident direction of the retrieving laser beam, and it is formed on the opposite side of the recording layer from the incident side. Namely, in a case where the retrieving laser beam enters from the substrate side, the reflective layer is formed usually on the opposite side of the recording layer from the substrate, and in a case where the retrieving laser beam enters from the recording layer side, the reflective layer is formed usually between the recording layer and the substrate (FIGS. 1(a), 1(b)).

As the material to be used for the reflective layer, a substance having a high reflectivity is preferred, and particularly preferred is a metal such as Au, Ag or Al which can be expected to have a heat dissipation effect also. The heat dissipation properties are determined by the film thickness and the thermal conductivity, and since the thermal conductivity is substantially in proportion to the volume resistivity in the case of such a metal, the heat dissipation performance may be represented by the sheet resistivity. The sheet resistivity is usually at least 0.05 Ω/□, preferably at least 0.1 Ω/□, and on the other hand, it is usually at most 0.6 Ω/□, preferably at most 0.5 Ω/□, more preferably at most 0.4 Ω/□, furthermore preferably at most 0.2 Ω/□.

This is to guarantee particularly high heat dissipation properties, and is necessary to suppress recrystallization to a certain extent in a case where competition between the formation of an amorphous phase and the recrystallization is remarkable in the formation of amorphous marks, as in the recording layer to be used for the optical information recording medium. In order to control the thermal conductivity of the reflective layer itself or to improve the corrosion resistance, e.g. Ta, Ti, Cr, Mo, Mg, V, Nb, Zr or Si may be added in a small amount to the above metal. The addition amount is usually at least 0.01 atomic % and at most 20 atomic %. An aluminum alloy containing at least one of Ta and Ti in an amount of at most 15 atomic %, particularly an alloy of $Al_\alpha Ta_{1-\alpha}$ ($0 \leq \alpha \leq 0.15$) is excellent in corrosion resistance, and is a particularly preferred reflective layer material with a view to improving the reliability of the optical information recording medium.

Particularly in a case where the film thickness of the second protective layer is at least 40 nm and at most 50 nm, the amount of the added element contained is preferably at most 2 atomic % so as to make the reflective layer have a high thermal conductivity.

Particularly preferred as the material of the reflective layer is one containing Ag as the main component. "Containing Ag as the main component" means that Ag is contained in an amount of at least 50 atomic % based on the entire reflective layer. The content of Ag based on the entire reflective layer is preferably at least 70 atomic %, more preferably at least 80 atomic %, furthermore preferably at least 90 atomic %, particularly preferably at least 95 atomic %. Most preferred with a view to increasing the heat dissipation properties is to employ pure Ag as the material of the reflective layer.

The reason why Ag is contained as the main component is as follows. Namely, recording is carried out again on recording marks which are stored for a long time, such a phenomenon may take place in some cases that the recrystallization speed of the phase-change recording layer is high only at the first recording immediately after the storage. The reason why such a phenomenon takes place is not clear, but is supposed to be because the size of the amorphous marks formed by the first recording immediately after the storage is smaller than the desired size of the marks due to increase in the recrystallization speed of the recording layer immediately after the storage. Accordingly, in a case where such a phenomenon takes place, Ag having extremely high heat dissipation properties may be used for the reflective layer to increase the cooling rate of the recording layer, whereby recrystallization of the recording layer at the first recording immediately after the storage can be suppressed and the size of the amorphous marks can be maintained to the desired size.

A Ag alloy containing one member of Mg, Ti, Au, Cu, Pd, Pt, Zn, Cr, Si, Ge, Bi and a rare earth element in an amount of at least 0.01 atomic % and at most 10 atomic % in Ag has also a high reflectivity and a high thermal conductivity, is excellent in heat resistance and is preferred.

The film thickness of the reflective layer is usually at least 10 nm so that the incident laser beam is completely reflected so that there is no transmitted light, and it is preferably at least 20 nm, more preferably at least 40 nm. Further, when it is too thick, there is no change in the heat dissipation effect, the productivity is unnecessarily deteriorated, and the cracks are likely to occur, and accordingly it is usually at most 500 nm. However, it is preferably at most 400 nm, more preferably at most 300 nm.

The recording layer, the protective layer and the reflective layer are formed usually by e.g. a sputtering method.

It is preferred to carry out deposition in an in-line apparatus having a recording layer target, a protective layer target and, if necessary, a reflective layer material target provided in the same vacuum chamber, with a view to preventing oxidation or contamination among the respective layers. Further, it is excellent in view of the productivity also.

(E) Protective Coating Layer

It is preferred to form a protective coating layer comprising a ultraviolet-curing resin or a thermosetting resin on the outermost surface side of the optical information recording medium, so as to prevent direct contact with the air or to prevent scars by the contact with foreign materials. The protective coating layer has a thickness of usually from 1 μm to several hundred μm. Further, a dielectric protective layer having high hardness may further be formed, or a resin layer may further be formed thereon.

(Initial Crystallization Method of Optical Information Recording Medium)

The recording layer is formed usually by a physical vapor deposition method in vacuum such as a sputtering method. However, in a state immediately after the deposition (as-deposited state), the recording layer is usually amorphous, and therefore, it is preferred to crystallize the recording layer to form a non-recorded or erased state. This operation is referred to as initialization (or initial crystallization). As the initial crystallization operation, a method such as oven annealing in a solid phase at a temperature of at least the crystallization temperature (usually from 150 to 300° C.) and at most the melting point, annealing under irradiation with a light energy of e.g. a laser beam or a flash lamp beam or melt initialization may, for example, be mentioned. In the present invention, among the above initial crystallization operations, it is preferred to employ melt initialization, since a phase-change recording material with a small formation of crystal nuclei is employed.

In the melt initialization, if the recrystallization speed is too slow, there will be a time until the thermal equilibrium is reached, whereby other crystalline phases are likely to be formed. Accordingly, it is preferred to increase the cooling rate to some extent. Further, if the recording layer is held in a melted state for a long time, the recording layer may cause flow, a think film such as the protective layer may peel off by the stress, or e.g. the resin substrate may deform, thus leading to destruction of the medium, such being unfavorable.

For example, the time for maintaining the temperature at a level of at least the melting point is preferably usually at most 10 μs, preferably at most 1 μs.

Further, for the melt initialization, it is preferred to employ a laser beam. It is particularly preferred to carry out initial crystallization by using an oval laser beam having its minor axis substantially in parallel with the scanning direction (hereinafter, this initialization method may sometimes be referred to as "bulk erasing"). In such a case, the length of the major axis is usually from 10 to 1000 μm, and the length of the minor axis is usually from 0.1 to 5 μm.

Here, the lengths of the major axis and the minor axis of the beam are defined from the half value width in a case where the light energy intensity distribution within the beam is measured. With respect to the beam shape also, the minor axis length is preferably at most 5 μm, more preferably at most 2 μm so as to easily realize local heating and rapid cooling in the minor axis direction.

As the laser beam source, various types may be used including, for example, a semiconductor laser and a gas laser. The power of the laser beam is usually from about 100 mW to about 10 W. Further, another light source may be used so long as a power density and a beam shape at the same level can be obtained. Specifically, a Xe lamp laser beam may, for example, be mentioned.

In the initialization by bulk erasing, when a disk-form recording medium is used for example, the minor axis direction of an oval beam is brought substantially into line with the circumferential direction, and by rotating the disk, scanning is carried out in the minor axis direction, while moving the beam in the major axis (radial) direction every one revolution (one rotation), whereby initialization can be carried out over the entire surface. By doing this, a poly-crystal structure aligned in a specific direction relative to the focused laser beam for recording/retrieving scanned along the track in the circumferential direction can be realized.

The moving distance in the radial direction per one rotation is preferably set to be shorter than the major axis of the beam, so that the irradiated regions overlap, and the same radial region will be irradiated a plurality of times with the laser beam. As a result, initialization can certainly be carried out, and at the same time, it is possible to avoid non-uniformity of the initial crystallization state attributable to the energy distribution (usually from 10 to 20%) in the radial direction of the beam. On the other hand, if the moving distance is too short, undesirable crystalline phases tend to be formed. Accordingly, the moving distance in the radial direction is usually set to be at least ½ of the major axis of the beam. Further, the scanning velocity of the initialization energy beam is usually within a range of from 3 to 20 m/s.

Whether or not at least the optical information recording medium of the present invention can be obtained by melt initialization can be judged by determining whether or not the reflectivity R1 in the non-recorded state after initialization is substantially equal to the reflectivity R2 in the erased state by recrystallization after recording of amorphous marks is carried out by a practical focused laser beam for recording (for example, a focused laser beam having a diameter of about 1 μm). Here, R2 is the reflectivity at the erased portion after recording 10 times.

Accordingly, the optical information recording medium of the present invention preferably satisfies the following relational expression (3) where the reflectivity at the non-recorded portion after initial crystallization is R1 and the reflectivity at the erased portion after recording 10 times is R2:

$$\Delta R = 2|R1 - R2|/(R1 + R2) \times 100\ (\%) \leq 10 \tag{3}$$

The reason why the reflectivity R2 at the erased portion after recording 10 times is taken as the judgment index is that when recording is carried out 10 times, the influence of the reflectivity in a crystalline state which may remain in a non-recorded state if recording is carried out only once, can be removed, and the entire surface of the optical information recording medium can be made to be in a state where it is recrystallized by recording and erasing at least once. On the other hand, if the number of recording is excessively higher than 10 times, factors other than the change in the crystal structure of the recording layer, such as microscopic deformation of the recording layer due to the repeated recording or diffusion of a foreign element from the protective layer to the recording layer may cause a change in the reflectivity, and accordingly it tends to be difficult to judge whether or not the desired crystalline state can be obtained.

In the above relational expression (3), $\Delta R$ is at most 10%, and it is preferably at most 5%. When it is at most 5%, an optical information recording medium having lower signal noises can be obtained.

For example, of an optical information recording medium with R1 of about 17%, R2 may be substantially within a range of from 16 to 18%.

The above erased state may also be obtained by irradiation with the writing power in a direct current fashion to melt the recording layer, followed by resolidification, without necessarily modulating the focused recording laser beam in accordance with a practical recording pulse-generating method.

In order to obtain the desired initial crystalline state of the phase-change recording material to be used for the recording layer in the present invention, it is particularly important to set the scanning velocity of the initialization energy beam relative to the recording layer plane. Basically, it is important that the crystalline state after initial crystallization is similar to the crystalline state at the erased portion after recording, and accordingly, the scanning velocity is in the vicinity of the relative scanning linear velocity of the focused laser beam to the recording layer face when practical recording is carried out by using a focused laser beam. Specifically, the initialization energy beam is scanned at a linear velocity of from about 20 to about 80% of the maximum linear velocity when recording is carried out on the optical information recording medium.

The maximum linear velocity for recording is, for example, a linear velocity when the erase ratio becomes at least 20 dB at the time of irradiation with an erasing power Pe in a direct current fashion at that linear velocity.

The erase ratio is defined as the difference between the carrier level of signals of the amorphous marks recorded substantially at a single frequency and the carrier level after erasing by direct current irradiation of Pe. Measurement of the erase ratio is carried out as follows for example. Firstly, under recording conditions under which adequate signal characteristics (i.e. such characteristics that e.g. the reflectivity and the signal amplitude or the jitter satisfy specified values) are obtained, a condition with a high frequency is selected among modified signals to be recorded, recording is carried out 10 times at a single frequency to form amorphous marks, and the carrier level (C.L. at recording) is measured. Then, the direct current irradiation is carried out once on the amorphous marks while changing the erasing power Pe, and the carrier level at this time (C.L. after erasing) is measured, to calculate the difference between C.L. at recording and C.L. after erasing, i.e. the erase ratio. When the power Pe of the direct current irradiation is changed, the erase ratio tends to increase once, decrease and then increase again in general. Here, the first peak value of the erase ratio observed when the power Pe starts being increased is taken as the erase ratio of the sample in this case.

With respect to the scanning rate of the initialization energy beam, if the initialization energy beam is scanned at a velocity lower by about 20% than the above defined maximum linear velocity, phase isolation may occur and a single phase is less likely to be obtained, or even if a single phase is obtained, crystallites may extend particularly in the initialization beam scanning direction and become giant, or aligned in an unfavorable direction. Preferably, the initialization energy beam is scanned at a velocity of at least 30% of the recordable maximum linear velocity.

On the other hand, if the initialization energy beam is scanned in a velocity equal to the recordable maximum linear velocity i.e. at a rate higher than about 80% of that, a region once melted by the initial scanning tends to be formed into an amorphous state again, such being unfavorable. This is because when the scanning linear velocity is high, the cooling rate of the melted portion tends to be high, and the time for resolidification tends to be short. With a focused recording laser beam having a diameter of about 1 micron, recrystallization by crystal growth from the crystalline region at the periphery of the melted region can be completed in a short time. However, in a case where scanning is carried out with an initialization oval laser beam, the melted region area in the major axis direction tends to be large, and accordingly it is necessary that recrystallization during resolidification is carried out over the entire melted region by lowering the scanning linear velocity than that at the time of practical recording. From such a viewpoint, the scanning linear velocity of the initial energy beam is preferably at most 70% of the recording maximum linear velocity, more preferably at most 60%, most preferably lower than 50%.

The optical information recording medium of the present invention has such characteristics that when initial crystallization is carried out by irradiation with a laser beam, it is possible to increase the moving speed of the medium relative to the laser beam. This makes it possible to carry out initial crystallization in a short time, and is preferred in view of improvement of the productivity and the cost reduction.

(Recording and Retrieving Method of Optical Information Recording Medium)

The recording/retrieving laser beam to be used for the optical information recording medium of the present invention is usually a laser beam such as a semiconductor laser or a gas laser, and its wavelength is usually from 300 to 800 nm, preferably from about 350 to about 800 nm. Particularly, in order to achieve a high areal density of at least 1 Gbit/inch$^2$, the focused laser beam diameter is required to be small, and it is desirable to obtain a focused laser beam by using a blue to red laser beam having a wavelength of from 350 to 680 nm and an object lens having a numerical aperture NA of at least 0.5.

In the present invention, as mentioned above, it is usually preferred that the amorphous state corresponds to recording marks. Further, in the present invention, it is effective to record information by the mark length modulation system. This is particularly remarkable at the time of the mark length recording with a shortest mark length of at most 4 μm, particularly at most 1 μm.

In a case where the recording mark is formed, recording by a conventional binary modulation system of the recording laser power may be carried out, however, in the present invention, it is particularly preferred to employ a recording method by a multi-level modulation system of at least ternary modulation wherein off-pulse periods are provided when a recording mark is formed as follows.

FIG. 2 is schematic views illustrating the power pattern of the recording laser beam in the recording method of an optical information recording medium. When an amorphous mark which is mark length-modulated into a length nT (wherein T is the reference clock period, and n is the mark length possible in the mark length modulation recording and is an integer), the amorphous mark is divided into m=n−k (provided that k is an integer of at least 0) recording pulses, each recording pulse width is $\alpha_i T$ ($1 \leq i \leq m$), and an off-pulse section with a time of $\beta_i T$ ($1 \leq i \leq m$) accompanies each recording pulse. With respect to the divided recording pulse in FIG. 2, description of the reference clock period T is omitted in view of understandability of the figure. Namely, in FIG. 2, a part which should be described as $\alpha_i T$ is described simply as $\alpha_i$ for example. Here, it is preferred that $\alpha_i \leq \beta_i$, or $\alpha_i \leq \beta_{i-1}$ ($2 \leq i \leq m$ or m−1). $\Sigma\alpha_i + \Sigma\beta_i$ is usually n, but it may be $\Sigma\alpha_i + \Sigma\beta_i = n+j$ (j is a constant which satisfies $-2 \leq j \leq 2$) so as to obtain an accurate nT mark.

At the time of recording, irradiation with a recording laser beam with an erasing power Pe which may crystallize the amorphous state is carried out between marks. Further, at $\alpha_i T$ (i=1 to m), irradiation with a recording laser beam with a writing power Pw sufficient to melt the recording layer is carried out, and at a time $\beta_i T$ ($1 \leq i \leq m-1$), irradiation with the recording laser beam with a bias power Pb which satisfies Pb<Pe, preferably Pb≦(½)Pe is carried out.

The power Pb of the recording laser beam irradiated in a time with a period $\beta_m T$ is usually Pb<Pe, preferably Pb≦½Pe, but it may be Pb≦Pe, similar to the period $\beta_i T$ ($1 \leq i \leq m-1$).

By employing the above recording method, the power margin or the recording linear velocity margin can be widened. This effect is particularly remarkable when the bias power Pb is set to be adequately low so that Pb≦½Pe.

The above recording system is a system particularly suitable for an optical information recording medium wherein the phase-change recording material of the present invention is used for the recording layer. This is because if the Ge amount is decreased to secure erasing (recrystallization) in a short time, the critical cooling rate required for amorphous mark recording tends to be extremely high, and formation of favorable amorphous marks tends to be difficult.

Namely, decrease in the Ge amount promotes recrystallization of the amorphous marks from the peripheral crystalline portion and at the same time, increases the crystal growth rate at the time of melting and resolidification. If the recrystallization speed from the periphery of the amorphous mark is increased above a certain level, recrystallization from the peripheral portion of the melted region proceeds at the time of resolidification of the melted region formed for amorphous mark recording, and accordingly the region which is originally to be formed into an amorphous state tends to be recrystallized without being formed into an amorphous state. Accordingly, it is important to set the bias power Pb to be adequately low, or to adequately secure the cooling section by making $\alpha_i \leq \beta_i$ or $\alpha_i \leq \beta_{i-1}$ ($2 \leq i \leq m$ or m−1).

Further, if the linear velocity at the time of recording increases, the clock period is shortened, whereby the off-pulse section is shortened, and the cooling effect tends to be impaired. In such a case, it is effective to divide the recording pulse at the time of nT mark recording, to set the cooling section by the off-pulse to be at least 1 nsec, more preferably at least 5 nsec by the real time.

[2-2] Application of Information Recording Medium Other Than Optical Information Recording Medium The information recording medium of the present invention can be used as an optical information recording medium, since reversible phase-change recording at least by irradiation with laser beam is possible, as described above. However, the rewritable information recording medium used in the present invention can be applied to phase-change recording by passing an electric current to a microscopic region. Explanation will be made below with respect to this point.

Figure 4:
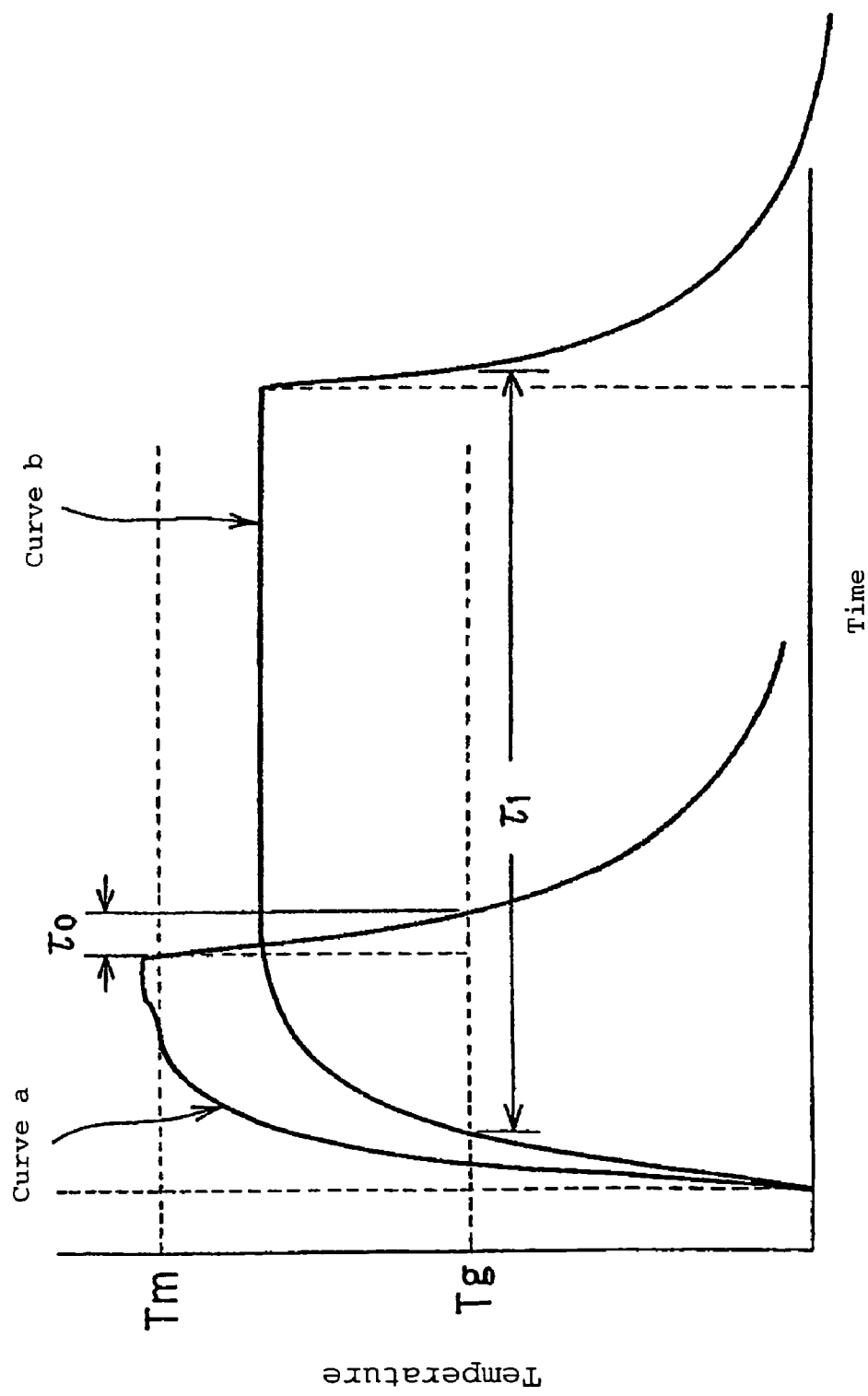
FIG. 4 is a schematic view illustrating the temperature history at the time of recording or at the time of erasing the rewritable information recording.

FIG. 4 is a schematic view illustrating the temperature history (curve a) at the time of amorphous mark recording, and the temperature history (curve b) at the time of erasing by recrystallization. At the time of recording, the temperature of the recording layer is increased to at least the melting point Tm in a short time by heating with an electric current at a high voltage and with a short pulse or a high power level laser beam, and after the electric current pulse or laser beam irradiation is turned off, the recording layer is rapidly cooled by heat dissipation to the periphery, and formed into an amorphous phase. When the cooling rate of the temperature at the time $\tau_0$ from the melting point Tm to the crystallization temperature Tg is higher than the critical cooling rate for formation of an amorphous phase, the recording layer is formed into an amorphous phase. On the other hand, at the time of erasing, the recording layer is heated to at least the crystallization temperature Tg and at most about the melting point Tm, by application of a relatively low voltage or irradiation with a laser energy at a low power level, and maintained for at least a certain time, whereby recrystallization of the amorphous marks proceeds in a substantially solid phase state. Namely, if the holding time $\tau_1$ is adequate, the crystallization will be completed.

Here, regardless of the state of the recording layer before application of the energy for recording or erasing, the recording layer is formed into an amorphous phase when the temperature history of the curve a is imparted to the recording layer, and the recording layer is crystallized when the temperature history of the curve b is imparted to the recording layer.

The reason why the rewritable information recording medium of the present invention may be used for phase-change recording by passing an electric current to the microscopic region, not only as an optical information recording medium, is as follows. Namely, it is the temperature history as shown in FIG. 4 that causes a reversible phase change, and the energy source which causes such a temperature history may be either a focused laser beam or an electric current heating (Joule heat by conducting).

The change in the resistivity accompanying the phase change between the crystalline phase and the amorphous phase of the phase-change recording material used in the present invention, is adequately equal to the change in the resistivity by at least two orders of magnitude, as obtained by a GeTe—$Sb_2Te_3$ pseudo binary alloy which is being developed as a non-volatile memory at present, particularly a $Ge_2Sb_2Te_5$ stoichiometrical composition alloy (J. Appl. Phys., vol. 87, pages 4130 to 4133, 2000). Namely, when the resistivity in an amorphous state in an as-deposited state, and the resistivity after crystallization by annealing, of a rewritable information recording medium using a phase-change recording material containing a composition represented by the above formula (1) as the main component, are respectively measured, whereupon changes by at least three figures are confirmed. It is considered that the amorphous and crystalline states obtained by formation into an amorphous phase and the crystallization by current pulses are slightly different from the above amorphous state in an as-deposited state and the above crystalline state by annealing, respectively. However, it is expected that also in a case where the phase-change recording material used in the present invention is subjected to phase change by current pulses, a large change in the resistivity by a level of two orders of magnitude can adequately occur, since the above change in the resistivity by at least three orders of magnitude can be obtained.

FIG. 5 is a cross-sectional view illustrating the structure of one cell of such a non-volatile memory. In FIG. 5, a voltage is applied between an upper electrode 1 and a lower electrode 2, and an electric current is applied to a phase-change recording layer 3 containing a phase-change recording material (hereinafter sometimes referred to simply as a phase-change recording layer 3) and a heater portion 4. The phase-change recording layer 3 is covered with an insulant 10 such as $SiO_2$. Further, the phase-change recording layer 3 is crystallized in the initial state. In this case, initial crystallization is carried out by heating the entire system of FIG. 5 to the crystallization temperature (usually from about 100 to about 300° C.) of the recording layer. In formation of an integrated circuit, the temperature increase to such an extent is commonly carried out.

In FIG. 5, a particularly narrow portion 4 (heater portion) functions as a local heater, since heat is likely to generate by the Joule heat by application of an electric current between the upper electrode 1 and the lower electrode 2. A reversibly changeable portion 5 adjacent thereto is locally heated and formed into an amorphous phase via the temperature history as shown by the curve a in FIG. 4, and recrystallized via the temperature history as shown by the curve b in FIG. 4.

As the reading, a low electric current is passed to such an extent that the heat generation at the heater portion 4 can be ignored, and the potential difference between the upper and lower electrodes is read. Here, there is also a difference in the electric capacity between the crystalline and amorphous states, and accordingly the difference in the electric capacity may be detected.

Practically, a further integrated memory has been proposed by employing a semiconductor integrated circuit formation technology (U.S. Pat. No. 6,314,014), however, its basic structure is as shown in FIG. 5, and when the phase-change recording material used in the present invention is incorporated in the phase-change recording layer 3, the same function can be realized.

Here, as the energy source which causes the temperature change as shown in FIG. 4, an electron beam may also be mentioned. As an example of a recording device employing an electron beam, a method wherein a phase-change recording material is locally irradiated with an electron beam radiated by a field emitter to cause a phase change, as disclosed in U.S. Pat. No. 5,557,596 may be mentioned.

The present invention is not limited to the above embodiments. The above embodiments are examples, and any one having substantially the same structure as the technical idea as disclosed in the scope of the present invention and having the same effects is included in the present invention.

EXAMPLES

Now, the present invention will be explained with reference to Examples wherein the phase-change recording material of the present invention is applied to an optical information recording medium. However, the present invention is by no means restricted to the application to an optical information recording medium within a range not to exceed the object of the present invention.

In the following Examples, an optical information recording medium may be referred to simply as "a disk", "an optical disk", "a phase-change type optical disk" etc. in some cases.

EXAMPLES 1 to 3 and COMPARATIVE EXAMPLES 1 and 2

For measurement of the composition of the phase-change recording material used for the recording layer of an optical information recording medium, an acid dissolution ICP-AES (Inductively Coupled Plasma-Atomic Emission Spectrometry) and a fluorescent X-ray analyzer were used. With respect to the acid dissolution ICP-AES, JY 38 S manufactured by JOBIN YVON was used as an analyzer, and the recording layer was dissolved in dil-$HNO_3$ and quantitative determination was carried out by a matrix matching calibration method. As the fluorescent X-ray analyzer, RIX3001 manufactured by Rigaku Denki Kogyo K.K. was used.

[Preparation of Phase-Change Type Optical Disk]

On a disk-shape polycarbonate substrate having a diameter of 120 mm and a thickness of 0.6 mm, having guide grooves with a groove width of 0.31 μm a groove depth of 29 nm and a groove pitch of 0.74 μm, a $(ZnS)_{80}(SiO_2)_{20}$ layer (80 nm), a Sb—Ge—In—M—Te layer (13 nm), a $(ZnS)_{80}(SiO_2)_{20}$ layer (20 nm), a Ta layer (2 nm) and a Ag layer (200 nm) were formed by a sputtering method, and a protective coating layer comprising an ultraviolet-curing resin was further formed to prepare a phase-change type optical disk.

The values of x, y, z and w when the composition of the Sb—Ge—In—M—Te recording layer is represented by $\{(Sb_{1-x}Ge_x)_{1-y}In_y\}_{1-z-w}M_zTe_w$ are shown in Table 1.

TABLE 1

| | | Composition | | | | |
|---|---|---|---|---|---|---|
| | Element M | x | y | z | w | Note |
| Ex. 1 | Tb | 0.08 | 0.19 | 0.03 | 0 | |
| Ex. 2 | Gd | 0.08 | 0.19 | 0.04 | 0 | |
| Ex. 3 | — | 0.07 | 0.19 | 0 | 0.05 | |
| Comp. Ex. 1 | — | 0.13 | 0.18 | 0 | 0 | |
| Comp. Ex. 2 | Tb | 0.01 | 0.2 | 0.25 | 0 | Initial crystallization infeasible |

Except for Comparative Example 2, the above compositions were substantially in accordance with the crystallization speed suitable for the following evaluation conditions. In the following initial crystallization and measurement of the disk characteristics, a glass substrate of 0.6 mm was overlaid on the opposite side to the laser beam incident side.

[Initial Crystallization]

Initial crystallization was tried on each of these disks as follows. Namely, a disk rotated at 10 m/s was irradiated with a laser beam having a wavelength of 810 nm and a power of 800 mW and having a shape with a width of about 1 μm and a length of about 75 μm so that the major axis of the laser beam would be perpendicular to the above guide grooves, and the laser beam was continuously moved in a radius direction with a feed amount of 50 μm per rotation to try initial crystallization. Initial crystallization could be carried out on disks of Examples 1, 2, 3 and Comparative Example 1 without any problem. However, no crystallization occurred (the reflectivity was not changed) on the disk of Comparative Example 2. Initial crystallization was tried similarly at a linear velocity of 2 m/s at a laser power of from 400 to 1000 mW, however, no crystallization occurred. Accordingly, it is considered that use of the disk of the Comparative Example 2 as a phase-change type optical disk is substantially difficult. It is considered to be because the Tb content in the recording layer of Comparative Example 2 is too high. Here, if the Ge amount is increased, the crystallization tends to be slower, and accordingly initial crystallization will be further difficult.

[Disk Characteristics]

With respect to the disks of Examples 1, 2 and 3 and Comparative Example 1, recording/erasing was carried out on the guide grooves and the disk characteristics were evaluated as follows, by means of an optical disk tester DDU 1000 manufactured by Pulstec Industrial Co., Ltd. having a pickup with NA of 0.65 and a laser wavelength of 650 nm.

Overwriting of EFM+ modulation signal was carried out at a linear velocity of 14 m/s up to 2000 times, and the relation between the recording cycle and the jitter when the recorded signal was retrieved was measured. The reference clock frequency at the time of recording was 104.9 MHz (reference clock period was 9.53 ns), and the recording laser division method was as follows.

Namely, when an amorphous mark with a length of nT (T is the reference clock period, and n is a natural number of from 3 to 14) was to be formed, the mark formation laser irradiation time was divided as shown in FIG. 2(b), and a recording pulse having a writing power Pw and an off-pulse having a bias power Pb were alternately irradiated. During the period for formation of the space between marks (crystalline portion), an erasing laser beam having an erasing power Pe was irradiated. In FIG. 2(b), for all n, m=n−1, $\alpha_i=0.5$ ($1 \leq i \leq m$), $\beta_i=0.5$ ($1 \leq i \leq m-1$) and $\beta_m=0$. Here, Pw=16 mW, Pb=0.8 mW and Pe=4.5 mW.

At the time of retrieving, jitter measurement was carried out at a linear velocity of 3.49 m/s. The jitter was normalized by a reference clock period of 38.2 ns at the retrieving linear velocity. Here, the jitter in the present invention is one obtained by normalizing by the reference clock period a standard deviation (jitter) of the difference in time against PLL clock of the leading edge and the trailing edge of binary signals obtained by passing the retrieving signals through an equalizer and LPF, followed by conversion to binary signals by a slicer. A detailed measurement method is prescribed in DVD-ROM standard or DVD-RW standard.

Figure 3:
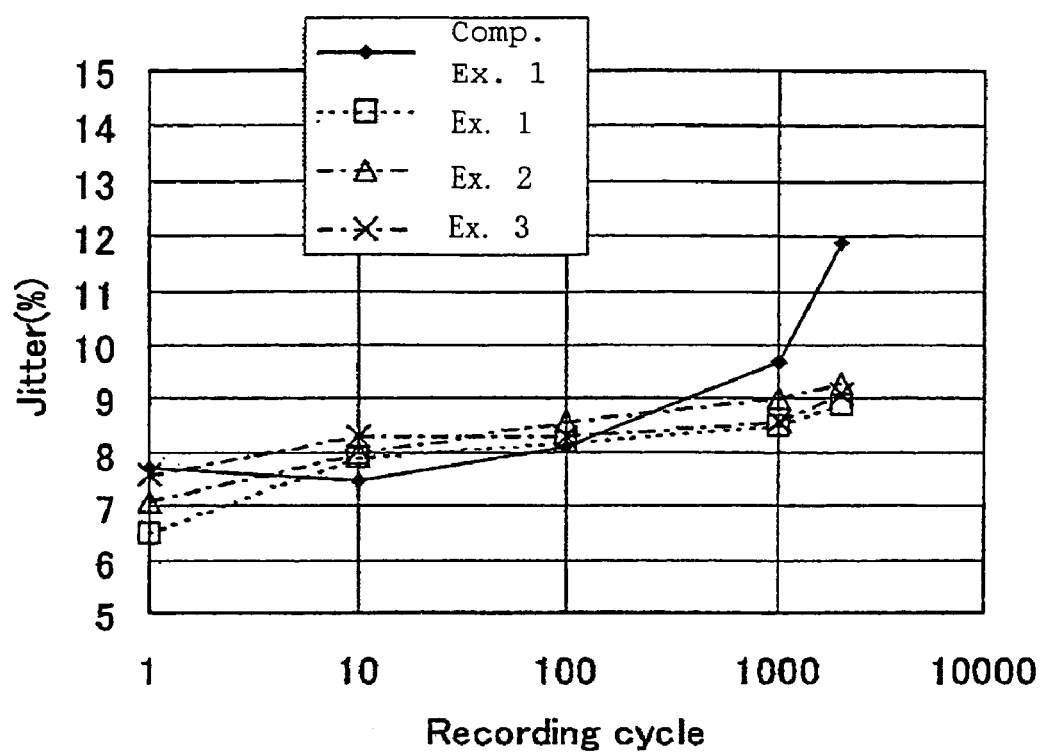
FIG. 3 is a graph illustrating the relation between the recording cycle and the jitter when a recorded signal is retrieved in Examples.

The result of the measurement of the relation between the recording cycle and the jitter when the recorded signal was retrieved is shown in FIG. 3. Of the disk of Comparative Example 1 using the Sb—Ge—In type phase-change recording material, the jitter value exceeded 11% by the repeated recording 2000 times, and use of the disk became difficult, whereas of the disks of Examples 1, 2 and 3 having Tb, Gd and Te added, the jitter value was at most 10% even after the repeated recording 2000 times. The disk of Comparative Example 1 after the repeated recording 2000 times, was irradiated with a DC laser beam of 4.5 mW once to try to erase the recording marks (crystallization), whereupon unerased marks were clearly shown by the observation on an oscilloscope. On the other hand, on the disks of Examples 1, 2 and 3, no such clear unerased marks were shown by the similar observation.

EXAMPLE 4

The following experiment was carried out to indicate possibility of recording by a change in the electric resistivity on the phase-change recording material used in the present invention.

Namely, on a polycarbonate substrate having a diameter of 120 mm, a Ge—In—Sb—Tb amorphous film having a film thickness of 50 nm and having the same composition as in Example 1 was prepared by sputtering.

The resistivity of the above amorphous film was measured, and then the amorphous film was crystallized and the resistivity of the film after crystallization was measured.

For initial crystallization, a laser beam having a wavelength of 810 nm and a power of 800 mW, and having a shape with a width of about 1 μm and a length of about 75 μm was used. While rotating the Ge—In—Sb—Tb amorphous film formed on the substrate at a linear velocity of 12 m/s, the amorphous film was irradiated with the laser beam so that the major axis of the laser beam would be perpendicular to the guide grooves formed on the substrate. Further, the laser beam was continuously moved in the radius direction with a feed amount of 50 μm per rotation to carry out initial crystallization.

For measurement of the resistivity, a resistivity measurement device Loresta MP (MCP-T350) manufactured by Dia Instruments Co., Ltd. was used.

No accurate resistivity of the amorphous film could be obtained since the resistivity was too high. However, in the measurement of another material having the same film thickness, a resistivity at a level of about $1 \times 10^{-1}$ Ωcm can be measured, and thus the resistivity of the composition of Example 1 in an amorphous state is considered to be higher than $1\times10^{-1}$ Ωcm. On the other hand, the resistivity of the Ge—In—Sb—Tb film after crystallization was $0.52\times10^{-4}$ Ωcm.

From the above results, it was found that there is a change in the resistivity by at least three figures between the amorphous state and the crystalline state of the phase-change recording material used in the present invention. Accordingly, it is found that the phase-change recording material used in the present invention provides a large difference in the resistivity by the phase change between the amorphous state and the crystalline state, and can be applied to a rewritable information recording medium on which recording is carried out by the change in the electric resistance.

INDUSTRIAL APPLICABILITY

According to the present invention, a phase-change recording material on which high speed recording/erasing is possible, which has excellent recording characteristics, which has high storage stability of the recording signals and which is excellent in repeated recording durability, and an information recording medium using the above material can be obtained.

The present invention has been described in detail with reference to specific embodiments, but it should be apparent to those skilled in the art that various changes and modifications can be made without departing from the intention and the scope of the present invention.

The present application is based on a Japanese Patent Application No. 2003-079834 (filed on Mar. 24, 2003), and the entirety is referred by a citation.

What is claimed is:

1. A phase-change recording material characterized by containing a composition represented by the following formula (1) as the main component:

$$\{(Sb_{1-x}Ge_x)_{1-y}In_y\}_{1-z-w}M_zTe_w \qquad (1)$$

wherein x, y, z and w are numbers satisfying $0.001 \leq x \leq 0.3$, $0 \leq y \leq 0.4$, $0 \leq z \leq 0.2$ and $0 \leq w \leq 0.1$, and M is at least one element selected from lanthanoids, provided that z and w are not 0 at the same time.

2. The phase-change recording material according to claim 1, wherein in the above formula (1), 0<z.

3. The phase-change recording material according to claim 1, wherein in the above formula (1), z/y is at least 0 and at most 1.

4. The phase-change recording material according to claim 1, wherein of the above phase-change recording material, the crystalline state corresponds to a non-recorded state and the amorphous state corresponds to a recorded state.

5. An information recording medium having a recording layer, characterized in that the above recording layer contains a composition represented by the following formula (1) as the main component:

$$\{(Sb_{1-x}Ge_x)_{1-y}In_y\}_{1-z-w}M_zTe_w \qquad (1)$$

wherein x, y, z and w are numbers satisfying $0.001 \leq x \leq 0.3$, $0 \leq y \leq 0.4$, $0 \leq z \leq 0.2$ and $0 \leq w \leq 0.1$, and H is at least one element selected from lanthanoids, provided that z and w are not 0 at the same time.

6. The information recording medium according to claim 5, wherein in the above formula (1), 0<z.

7. The information recording medium according to claim 5, wherein in the above formula (1), z/y is at least 0 and at most 1.

8. The information recording medium according to claim 5, wherein of the above information recording medium, the crystalline state corresponds to a non-recorded state and the amorphous state corresponds to a recorded state.

9. The information recording medium according to claim 5, wherein the above information recording medium is an optical information recording medium.

10. The information recording medium according to claim 9, wherein the above optical information recording medium further has a protective layer.

11. The information recording medium according to claim 9, wherein the above optical information recording medium further has a reflective layer, and the reflective layer contains Ag as the main component.

* * * * *

UNITED STATES PATENT AND TRADEMARK OFFICE
CERTIFICATE OF CORRECTION

PATENT NO. : 7,081,289 B2  Page 1 of 1
APPLICATION NO. : 11/113119
DATED : July 25, 2006
INVENTOR(S) : Ohno et al.

It is certified that error appears in the above-identified patent and that said Letters Patent is hereby corrected as shown below:

On the title page, Item (63), the domestic priority information is incorrect. Item (63) should read:

-- (63)     Related U.S. Application Data

Continuation of application No. PCT/JP04/04002,
Filed on Mar. 24, 2004. --

Signed and Sealed this

Twenty-fifth Day of March, 2008

JON W. DUDAS
*Director of the United States Patent and Trademark Office*